US009646987B2

(12) United States Patent
Watanabe

(10) Patent No.: US 9,646,987 B2
(45) Date of Patent: May 9, 2017

(54) SEMICONDUCTOR MEMORY DEVICE AND PRODUCTION METHOD THEREOF

(71) Applicant: KABUSHIKI KAISHA TOSHIBA, Minato-ku (JP)

(72) Inventor: Takashi Watanabe, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/817,748

(22) Filed: Aug. 4, 2015

(65) Prior Publication Data
US 2016/0358935 A1 Dec. 8, 2016

Related U.S. Application Data

(60) Provisional application No. 62/170,286, filed on Jun. 3, 2015.

(51) Int. Cl.
| H01L 27/11556 | (2017.01) |
| H01L 27/11582 | (2017.01) |
| H01L 23/528 | (2006.01) |
| H01L 21/3213 | (2006.01) |
| H01L 21/311 | (2006.01) |
| H01L 21/027 | (2006.01) |
| H01L 21/8239 | (2006.01) |

(52) U.S. Cl.
CPC .... *H01L 27/11582* (2013.01); *H01L 21/0273* (2013.01); *H01L 21/31144* (2013.01); *H01L 21/32139* (2013.01); *H01L 21/8239* (2013.01); *H01L 23/528* (2013.01); *H01L 27/11556* (2013.01)

(58) Field of Classification Search
CPC ........... H01L 21/0273; H01L 21/31144; H01L 21/32139; H01L 23/528; H01L 27/11556; H01L 27/11582
See application file for complete search history.

(56) References Cited

U.S. PATENT DOCUMENTS 8,598,032 B2 12/2013 Chen et al.
8,680,604 B2 3/2014 Higashi et al.
(Continued)

FOREIGN PATENT DOCUMENTS

| JP | 2010-192589 | 9/2010 |
| JP | 2012-244180 | 12/2012 |
| JP | 2014-138188 | 7/2014 |

*Primary Examiner* — Christine Enad
(74) *Attorney, Agent, or Firm* — Oblon, McClelland, Maier & Neustadt, L.L.P.

(57) ABSTRACT

A semiconductor memory device according to an embodiment comprises a memory cell array including a stacked body and a semiconductor film, the stacked body including first layers stacked in a third direction, the semiconductor film having a side surface facing the first layers, and the semiconductor film extending in the third direction. The stacked body has a first portion and a second portion, the first portion having a first end which is an end in a first direction, and the first portion having the semiconductor film disposed therein, and a second portion being positioned on a side of the first end of the first portion, and the second portion having disposed therein a connecting line that contacts one of the first layers and extends in the third direction. The second portion has a projecting portion that projects further in the second direction than the first portion.

12 Claims, 22 Drawing Sheets

(56) References Cited

U.S. PATENT DOCUMENTS

| | | | |
|---|---|---|---|
| 2010/0078701 A1* | 4/2010 | Shim | H01L 27/11521 257/314 |
| 2012/0032245 A1* | 2/2012 | Hwang | H01L 27/11551 257/314 |
| 2012/0052674 A1* | 3/2012 | Lee | H01L 27/11578 438/591 |
| 2012/0119283 A1* | 5/2012 | Lee | H01L 27/11519 257/316 |
| 2014/0197546 A1 | 7/2014 | Hwang et al. | |
| 2016/0172366 A1* | 6/2016 | Koka | H01L 29/7883 257/314 |
| 2016/0218059 A1* | 7/2016 | Nakada | H01L 23/528 |

* cited by examiner

SEMICONDUCTOR MEMORY DEVICE AND PRODUCTION METHOD THEREOF

CROSS-REFERENCE TO RELATED APPLICATIONS

This application is based upon and claims the benefit of priority from the prior U.S. Provisional Application 62/170,286, filed on Jun. 3, 2015, the entire contents of which are incorporated herein by reference.

BACKGROUND

Field

Embodiments of the present invention relate to a semiconductor memory device and a production method thereof.
Description of the Related Art
One kind of semiconductor memory device is a flash memory. In particular, a NAND type flash memory is generally and widely used since it is low cost and has a large capacity. Moreover, up to now, many technologies for further increasing the capacity of this NAND type flash memory have been proposed. One such technology is a structure in which memory cells are disposed three-dimensionally.

BRIEF DESCRIPTION OF THE DRAWINGS

FIGS. 6A and 6B to 11A and 11B are plan views and cross-sectional views explaining production steps of the memory cell array in the semiconductor memory device according to the same comparative example.

FIGS. 13A, 13B, and 13C to 18A, 18B, and 18C are plan views and cross-sectional views explaining production steps of the memory cell array in the semiconductor memory device according to the same embodiment.

FIGS. 20A and 20B to 22A and 22B are plan views of a surplus portion periphery of the memory cell array in the semiconductor memory device according to the same embodiment.

DETAILED DESCRIPTION

A semiconductor memory device according to an embodiment comprises, when three directions intersecting each other are assumed to be a first direction, a second direction, and a third direction, a memory cell array, the memory cell array including a stacked body and a semiconductor film, the stacked body including a plurality of first layers stacked in the third direction, the semiconductor film having a side surface facing the plurality of first layers, and the semiconductor film extending in the third direction. The stacked body has a first portion and a second portion, the first portion having a first end which is an end in the first direction, and the first portion having the semiconductor film disposed therein, and the second portion being positioned on a side of the first end of the first portion, and the second portion having disposed therein a connecting line that contacts one of the plurality of first layers and extends in the third direction. The second portion has a projecting portion that projects further in the second direction than the first portion.

Semiconductor memory devices and production methods thereof according to embodiments will be described below with reference to the drawings.

Note that each of the drawings employed in the description below is schematic, and thicknesses, widths, ratios, and so on, of each of configurations are not limited to those of the drawings.

Moreover, the embodiments described below are examples. The examples below describe semiconductor memory devices having a structure in which a memory string extends linearly in a perpendicular direction to a semiconductor substrate, but the present invention may be similarly applied also to a semiconductor memory device having a U-shaped structure in which the memory string is doubled back on an opposite side midway.

In addition, the semiconductor memory devices according to the embodiments described below employ: a semiconductor film which is a columnar body extending perpendicularly to the semiconductor substrate and which functions as a channel; and a MONOS (Metal-Oxide-Nitride-Oxide-Semiconductor) type memory cell (transistor), and have a structure in which a plurality of these memory cells are provided in a height direction. However, the present invention may be applied also to a semiconductor memory device employing a SONOS (Semiconductor-Oxide-Nitride-Oxide-Semiconductor) type memory cell, a floating gate type memory cell, and so on.

First Embodiment

First, an overall configuration of a semiconductor memory device according to a first embodiment will be described.

Figure 1:
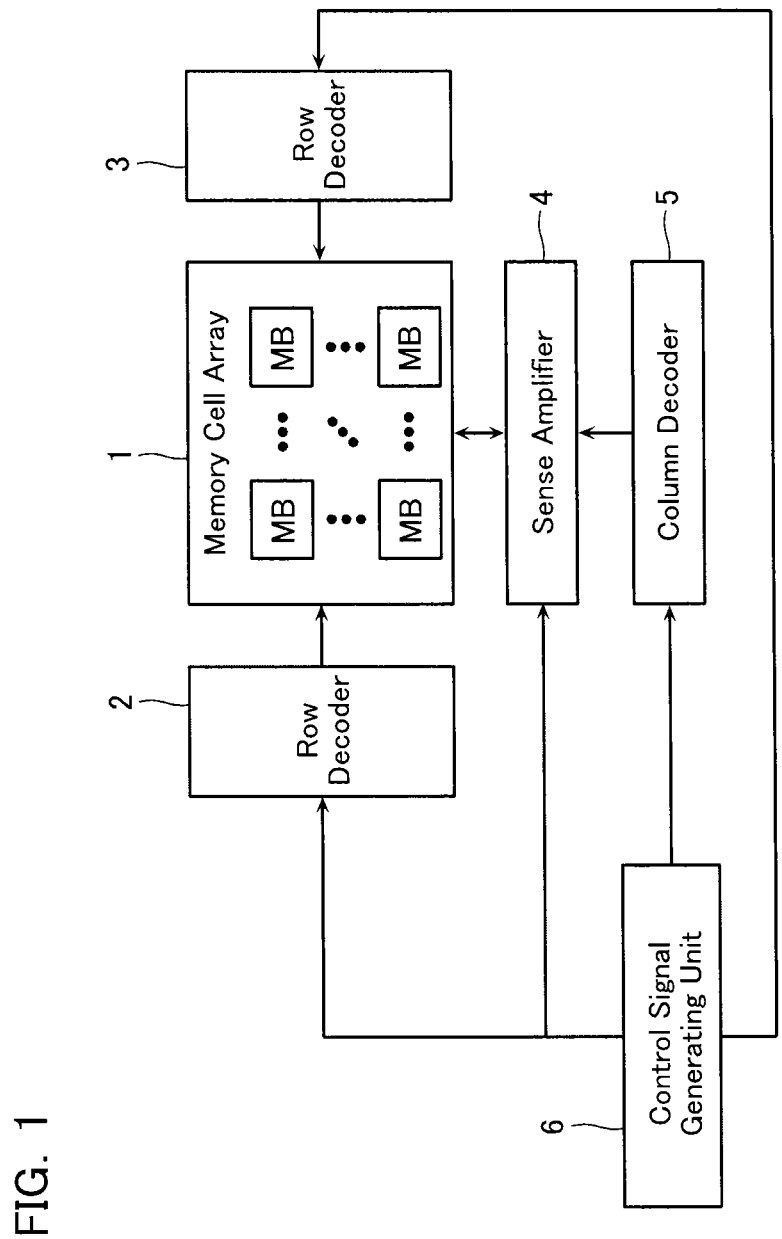
FIG. 1 is a functional block diagram of a semiconductor memory device according to a first embodiment.

FIG. 1 is a functional block diagram of the semiconductor memory device according to the present embodiment.

This semiconductor memory device comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or an erase operation, generates a control signal and controls the row decoders 2 and 3, the sense amplifier 4, and the column decoder 5.

Next, a circuit configuration of the memory cell array 1 will be described.

Figure 2:
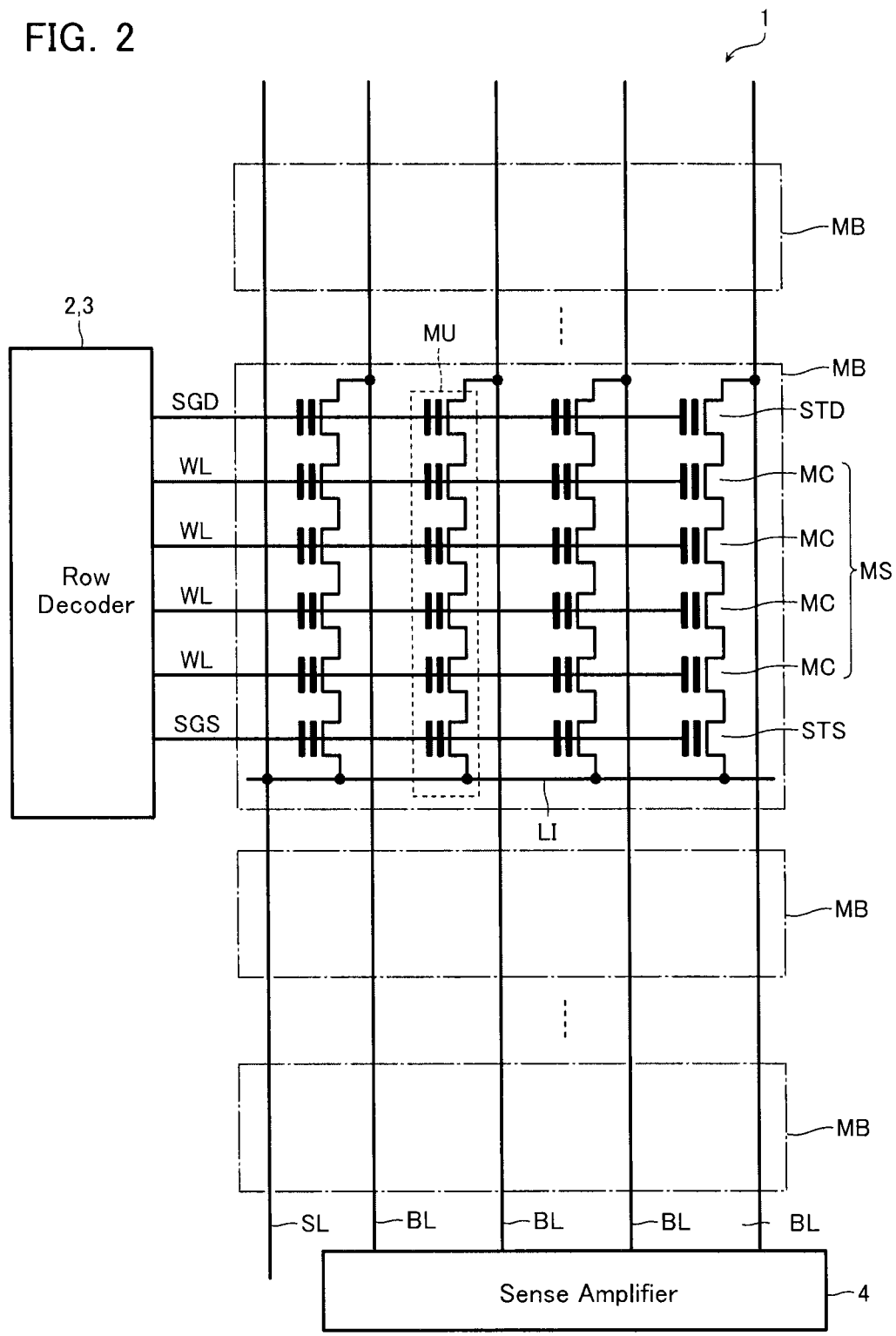
FIG. 2 is an equivalent circuit diagram of a memory cell array in the semiconductor memory device according to the same embodiment.

FIG. 2 is an equivalent circuit diagram of the memory cell array in the semiconductor memory device according to the present embodiment.

The memory cell array 1 includes the plurality of memory blocks MB. Moreover, commonly connected to these plurality of memory blocks MB are a plurality of bit lines BL and a source line SL. Each of the memory blocks MB is connected to the sense amplifier 4 via the bit lines BL, and is connected to an unillustrated source line driver via the source line SL.

The memory block MB includes a plurality of memory units MU. Each of the memory units MU has its one end connected to the bit line BL and has its other end connected to the source line SL via a source contact LI.

The memory unit MU includes a plurality of the memory cells MC connected in series. As will be described later, the memory cell MC has a semiconductor layer, a charge accumulation layer, and a control gate, and accumulates a charge in the charge accumulation layer according to a voltage applied to the control gate, thereby changing a threshold value of the memory cell MC. Note that hereafter, the plurality of memory cells MC connected in series will sometimes also be referred to as "memory string MS".

Commonly connected to the control gates of the memory cells MC configuring a certain memory string MS and the memory cells MC configuring another memory string MS are word lines WL. Moreover, these memory cells MC are connected to the row decoder 2 or 3 via these word lines WL.

Moreover, the memory unit MU includes: a source side select transistor STS connected between the memory string MS and the source contact LI; and a drain side select transistor STD connected between the memory string MS and the bit line BL. Connected to a control gate of the source side select transistor STS is a source side select gate line SGS. The source side select gate line SGS is connected to the row decoder 2 or 3, and selectively connects the memory string MS and a semiconductor substrate SB based on an inputted signal. On the other hand, connected to a control gate of the drain side select transistor STD is a drain side select gate line SGD. The drain side select gate line SGD is connected to the row decoder 2 or 3, and selectively connects the memory string MS and the bit line BL based on an inputted signal.

Next, a configuration of the memory cell array 1 will be described.

Figure 3:
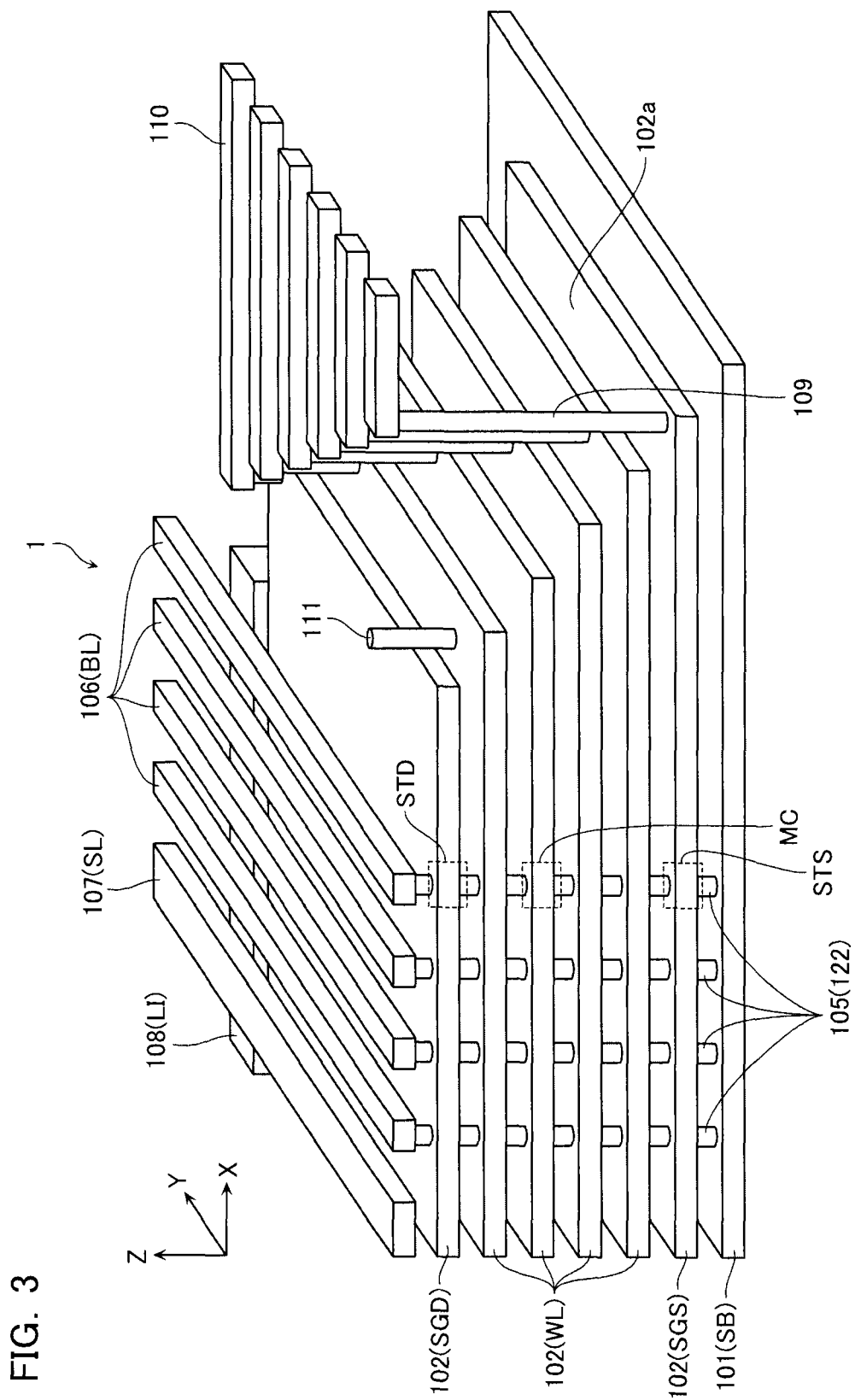
FIG. 3 is a perspective view showing a structure of the memory cell array in the semiconductor memory device according to the same embodiment.

FIG. 3 is a perspective view showing a structure of the memory cell array in the semiconductor memory device according to the present embodiment.

The memory cell array 1 includes: a semiconductor substrate 101 (SB); a plurality of conductive layers 102 stacked in a Z direction on the semiconductor substrate 101; and a plurality of memory columnar bodies 105 extending in the Z direction. An intersection of the conductive layer 102 and the memory columnar body 105 functions as the source side select transistor STS, the memory cell MC, or the drain side select transistor STD. The conductive layer 102 is formed from the likes of tungsten (W) or polysilicon (Poly-Si), for example, and functions as the word line WL, the source side select gate line SGS, or the drain side select gate line SGD.

The plurality of conductive layers 102 have their ends formed in steps. That is, the conductive layer 102 has a contact portion 102a that does not face a lower surface of the conductive layer 102 positioned in a layer above it. Moreover, the conductive layer 102 contacts a via 109 in the contact portion 102a. Moreover, a wiring line 110 contacts an upper end of the via 109. Note that the via 109 and the wiring line 110 are formed from the likes of tungsten (W).

In addition, the memory cell array 1 comprises a conductive layer 108. The conductive layer 108 faces side surfaces in a Y direction of the plurality of conductive layers 102, and extends in an X direction. A lower surface of the conductive layer 108 contacts the semiconductor substrate 101. The conductive layer 108 is formed from the likes of tungsten (W), for example, and functions as the source contact LI.

Moreover, the memory cell array 1 comprises a plurality of conductive layers 106 and a conductive layer 107 that are positioned above the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is formed from the likes of tungsten (W), for example, and functions as the bit line BL. Moreover, the conductive layer 108 is connected to a lower surface of the conductive layer 107. The conductive layer 107 is formed from a conductive layer of the likes of tungsten (W), for example, and functions as the source line SL.

In addition, the memory cell array 1 includes a beam columnar body 111. The beam columnar body 111 supports a posture of an unillustrated inter-layer insulating layer formed between the plurality of conductive layers 102, in a production step of the memory cell array 1.

Next, a configuration of the memory cell MC will be described.

Figure 4:
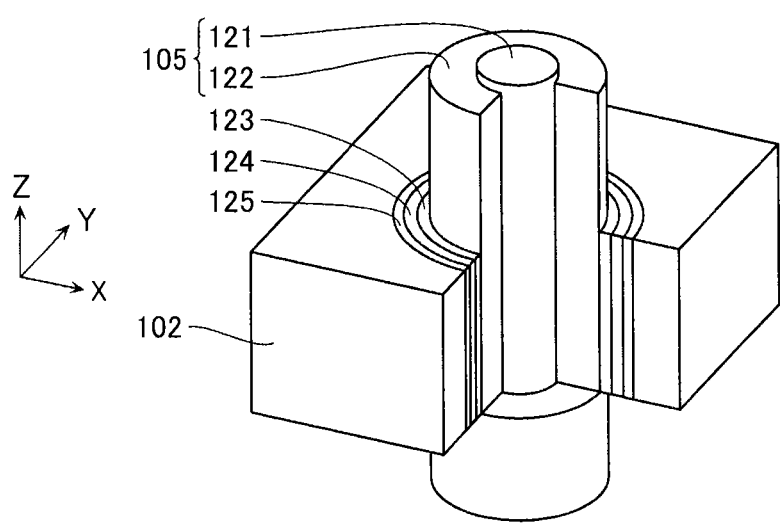
FIG. 4 is a perspective view showing a structure of a memory cell in the semiconductor memory device according to the same embodiment.

FIG. 4 is a perspective view showing a structure of the memory cell in the semiconductor memory device according to the present embodiment. Note that the source side select transistor STS and the drain side select transistor STD may also have a similar structure to that of FIG. 4.

The memory cell MC is provided at an intersection of the conductive layer 102 and the memory columnar body 105. The memory columnar body 105 includes: a core insulating layer 121; and a semiconductor layer 122 (semiconductor film) that covers a sidewall of the core insulating layer 121. Furthermore, provided between the semiconductor layer 122 and the conductive layer 102 are a tunnel insulating layer 123, a charge accumulation layer 124, and a block insulating layer 125. The core insulating layer 121 is formed from the likes of silicon oxide ($SiO_2$), for example. The semiconductor layer 122 is formed from the likes of polysilicon, for example, and functions as a channel of the memory cell MC, the source side select transistor STS, or the drain side select transistor STD. The tunnel insulating layer 123 is formed from the likes of silicon oxide ($SiO_2$), for example. The charge accumulation layer 124 is formed from a material capable of accumulating a charge, of the likes of silicon nitride (SiN), for example. The block insulating layer 125 is formed from the likes of silicon oxide ($SiO_2$), for example.

Next, a structure of the contact portion 102a of the memory cell array 1 of the present embodiment will be described using a comparative example.

Figure 5A:
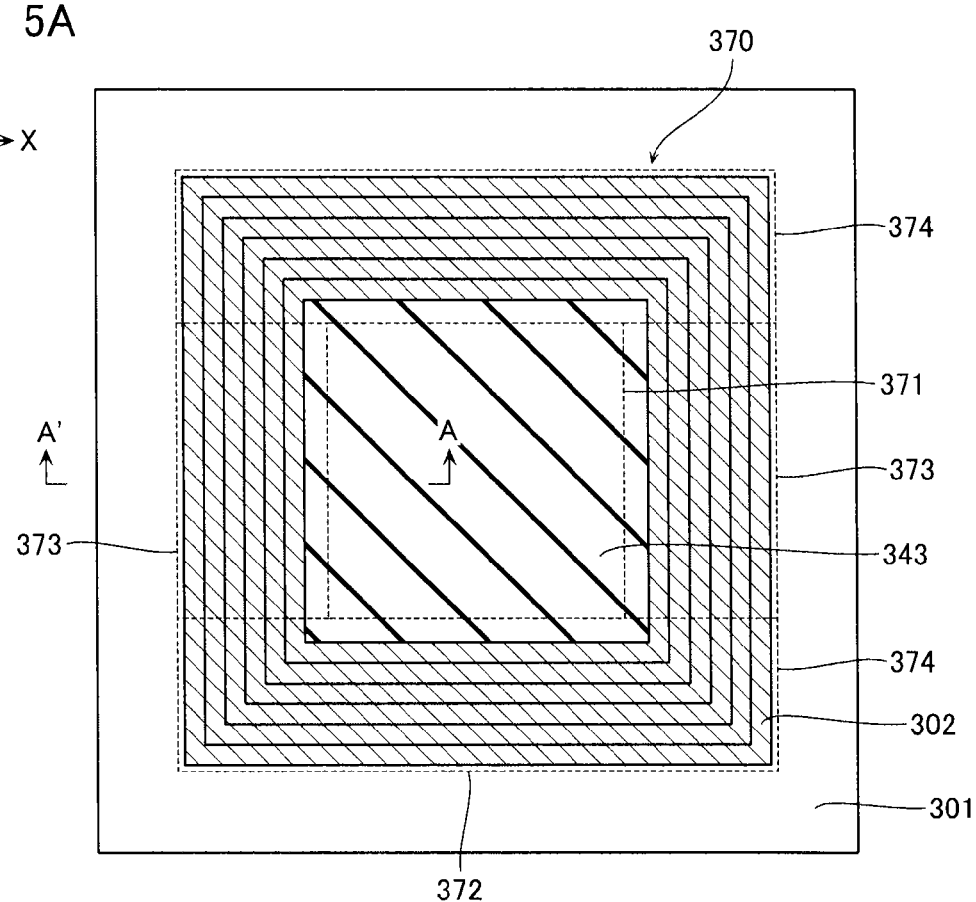
FIGS. 5A and 5B are a plan view and a cross-sectional view of a memory cell array in a semiconductor memory device according to a comparative example to the same embodiment.
Figure 5B:
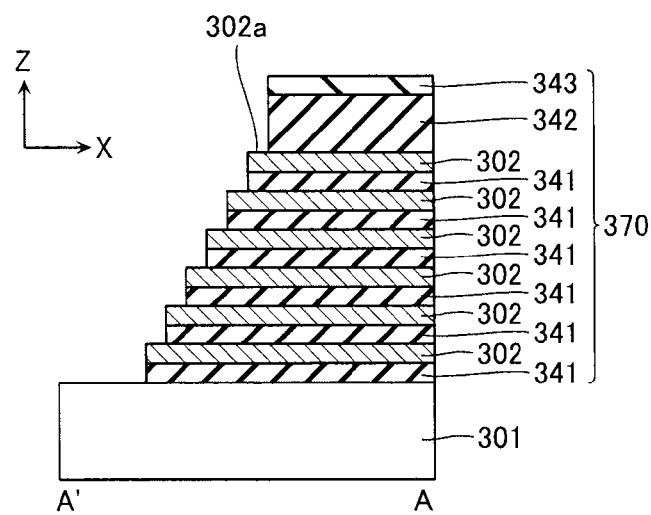

FIG. 5A is a plan view of a memory cell array in a semiconductor memory device according to a comparative example to the present embodiment; and FIG. 5B is a cross-sectional view of the memory cell array taken along the line A-A' shown in FIG. 5A.

A memory cell array 300 of the comparative example includes a stacked body 370 on a semiconductor substrate 301 (corresponding to 101), the stacked body 370 including: a plurality of inter-layer insulating layers 341 and conductive layers 302 (corresponding to 102) stacked alternately in the Z direction; and a stopper layer 343 having a substantially rectangular outer shape and stacked via an inter-layer insulating layer 342 on the uppermost layer conductive layer 302. In other words, a top layer of the stacked body 370 is the stopper layer 343.

The stacked body 370 has: a memory portion 371 which is substantially rectangular and covered by the stopper layer 343 when viewed from the Z direction; and an outer peripheral portion 372 surrounding the memory portion 371 on four sides. The outer peripheral portion 372 has: a contact portion 373 which is in an arrangement range of the memory portion 371 in the Y direction and is adjacent in the X direction to the memory portion 371; and a surplus portion 374 which is outside the arrangement range of the memory portion 371 in the Y direction and is adjacent in the Y direction to the memory portion 371 and the contact portion 373.

The memory portion 371 includes a plurality of memory columnar bodies 305 (not illustrated) that penetrate in the Z direction from the stopper layer 343 to the lowermost layer inter-layer insulating layer 341 to reach an upper surface of the semiconductor substrate 301. The memory columnar body 305 has a similar structure to the memory columnar body 105.

The contact portion 373 is formed in steps extending in the X direction from an end in the X direction of the memory portion 371, such that, when viewed from the Z direction, a contact portion 302a (corresponding to 102a) at an end of each of the conductive layers 302 is not concealed by another conductive layer 302 in a higher layer. The contact portion 373 is a portion with which a via 309 (corresponding to 109) is contacted. Hereafter, a portion not facing in the Z direction another conductive layer in a layer above, of each of the conductive layers will sometimes also be referred to as "terrace".

The surplus portion 374 is formed in steps extending in the X direction and the Y direction from ends in the Y direction of the memory portion 371 and the contact portion 373. A stepped structure of the surplus portion 374 is formed continuously with a stepped structure of the contact portion 373. The surplus portion 374 is a portion caused by formation of the contact portion 373 in a later-to-be-described production step of the memory cell array 300, and is not employed in connection of the via 309, and so on.

Next, a production method of the memory cell array 300 will be described.

FIGS. 6A to 12A are plan views explaining production steps of the memory cell array in the semiconductor memory device according to the present comparative example; and FIGS. 6B to 12B are cross-sectional views explaining the production steps of the memory cell array, taken along the lines A-A' of FIGS. 6A to 12A.

Figure 6A:
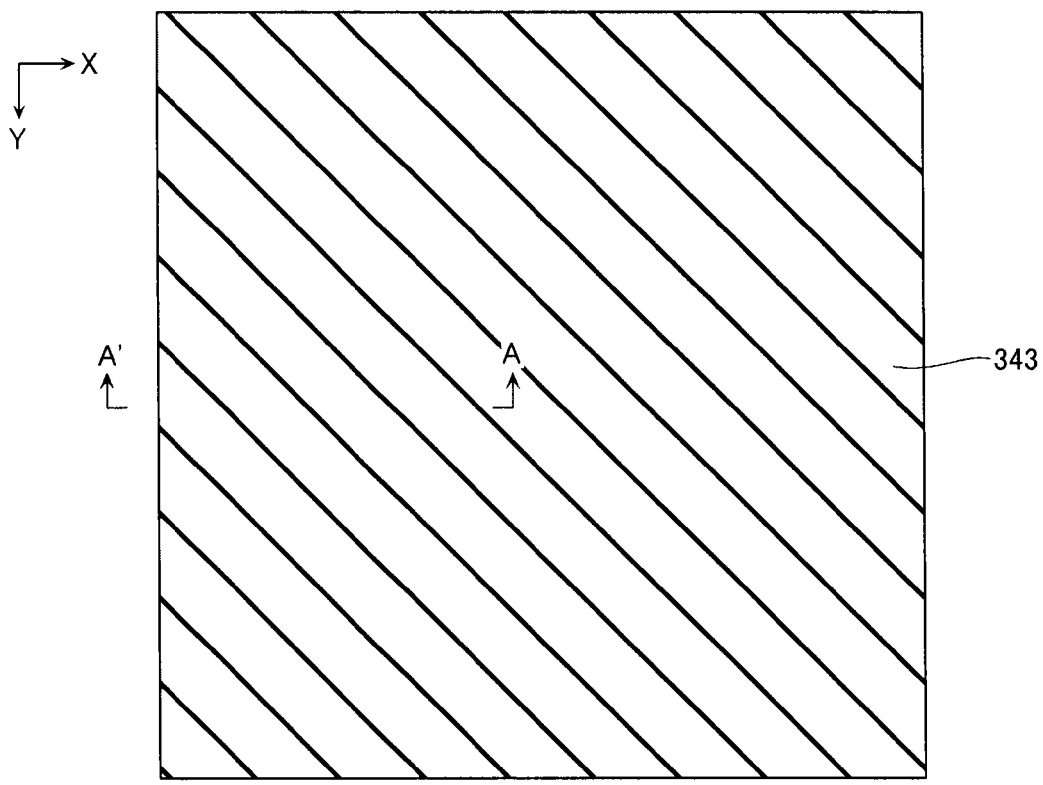
Figure 6B:
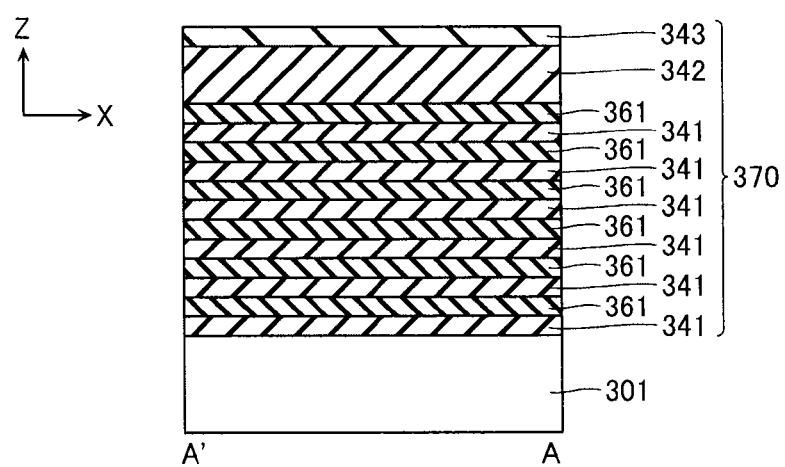

First, as shown in FIGS. 6A and 6B, a plurality of the inter-layer insulating layers 341 and sacrifice layers 361 are stacked alternately in the Z direction on the semiconductor substrate 301 where a lower structure (not illustrated) has been formed. Now, the sacrifice layer 361 is a layer replaced by the conductive layer 302 in a later step. Note that sometimes, the conductive layer 302 is stacked directly, instead of the sacrifice layer 361. Then, the inter-layer insulating layer 342 and the stopper layer 343 are stacked on the uppermost layer sacrifice layer 361. As a result, the stacked body 370 is formed.

Figure 7A:
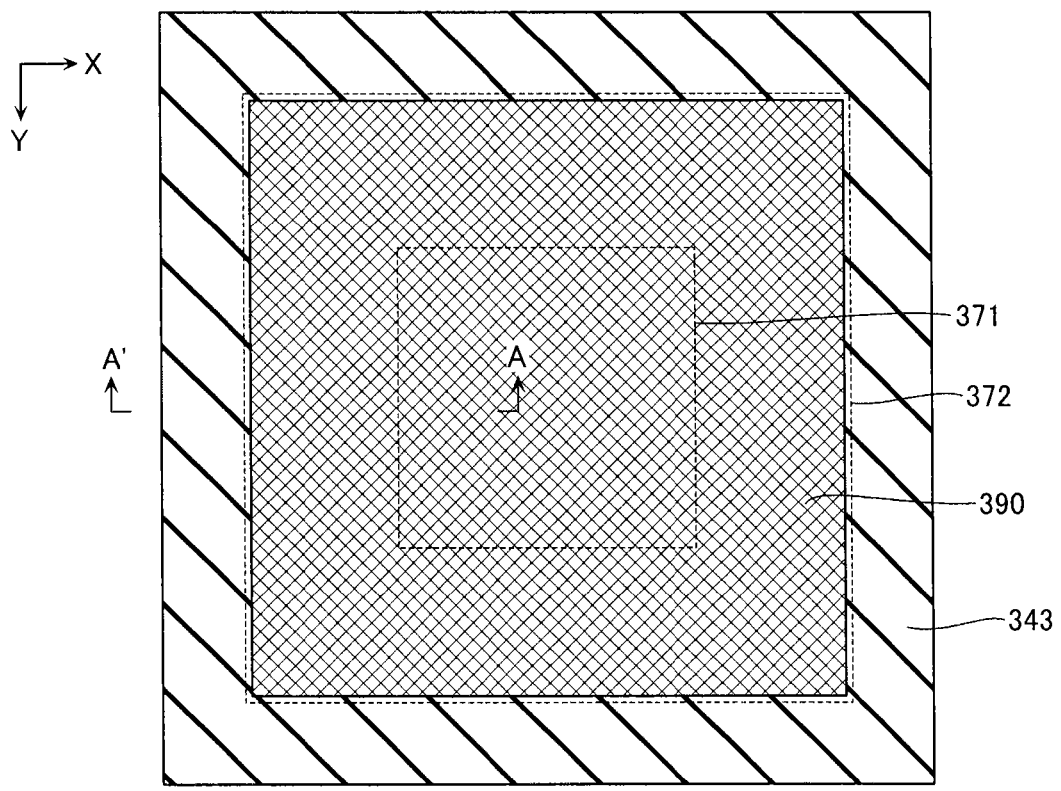
Figure 7B:
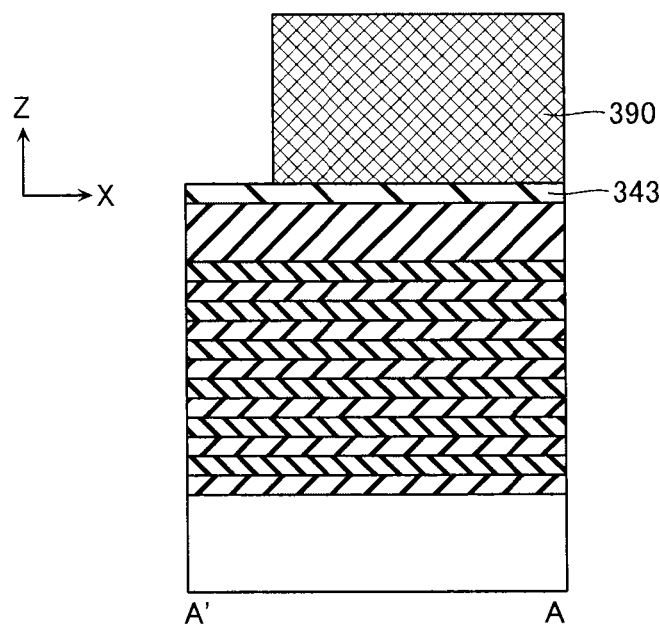

Then, as shown in FIGS. 7A and 7B, a resist 390 is formed on the stopper layer 343 by a lithography method. At this time, the resist 390 is formed in a final arrangement region of the memory portion 371 and the outer peripheral portion 372.

Figure 8A:
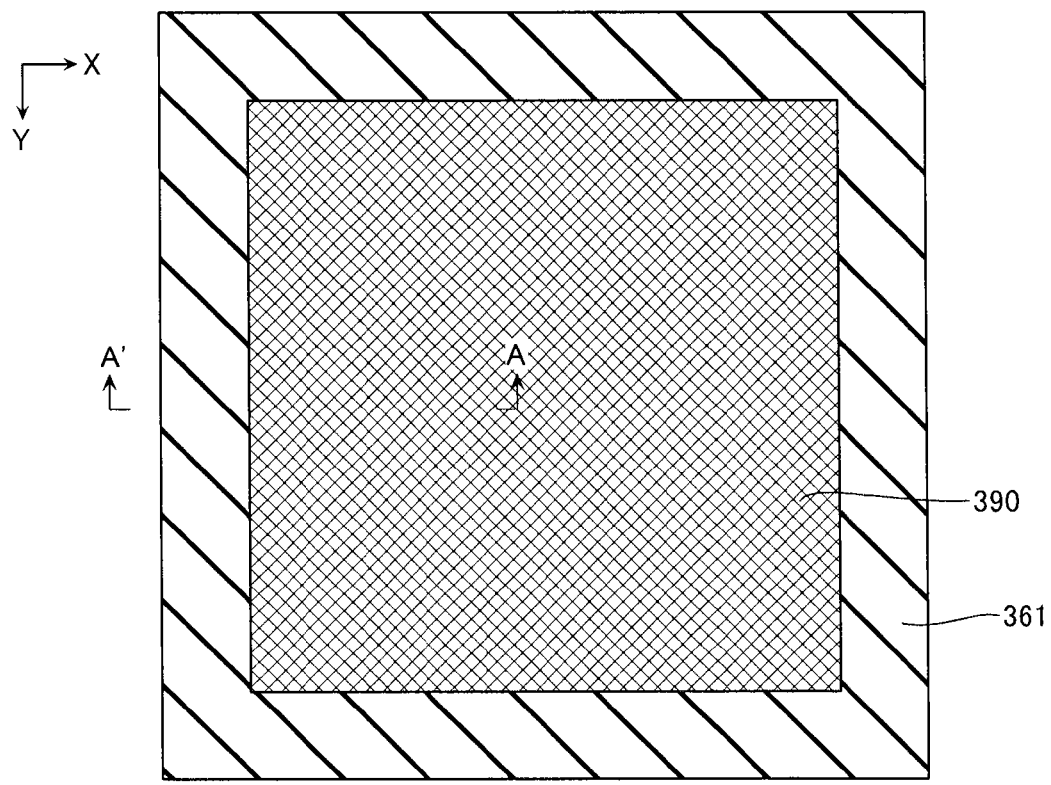
Figure 8B:
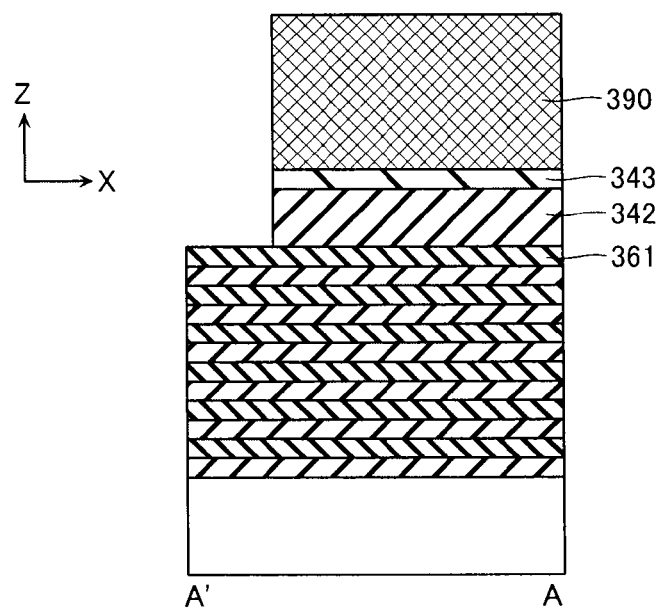

Then, as shown in FIGS. 8A and 8B, parts of the stopper layer 343 and the inter-layer insulating layer 342 are etched by a dry etching method that uses the resist 390 as a mask. As a result, an end of the sacrifice layer 361 is exposed upwardly.

Figure 9A:
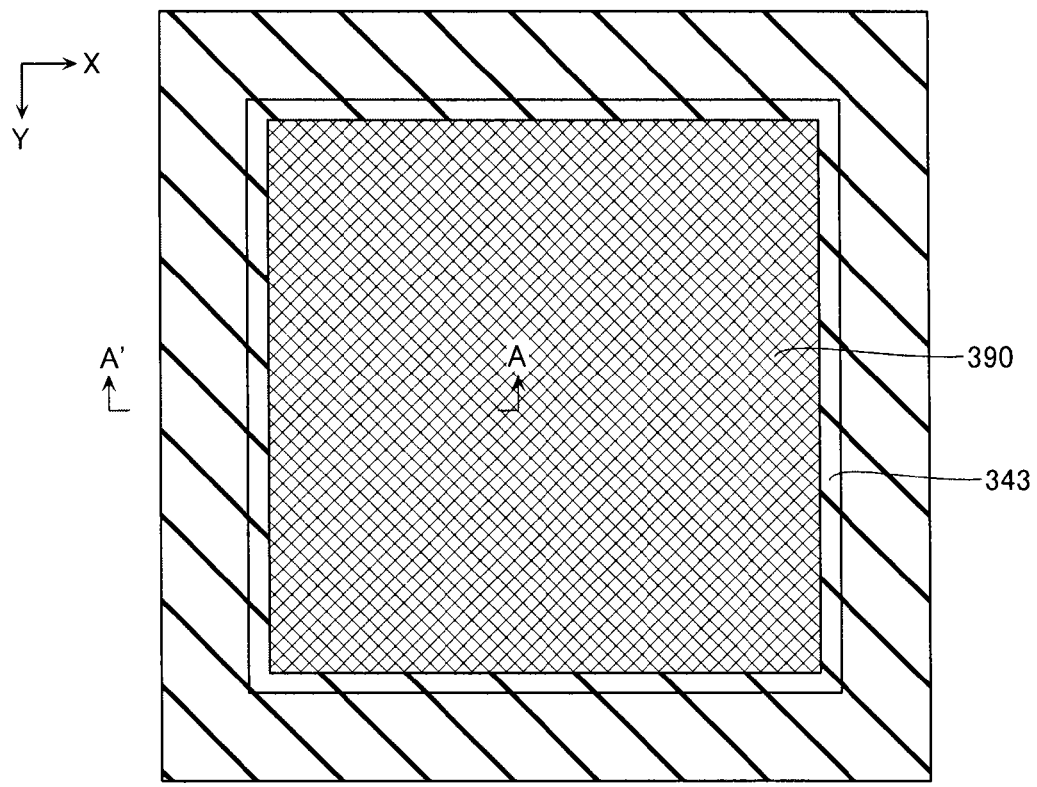
Figure 9B:
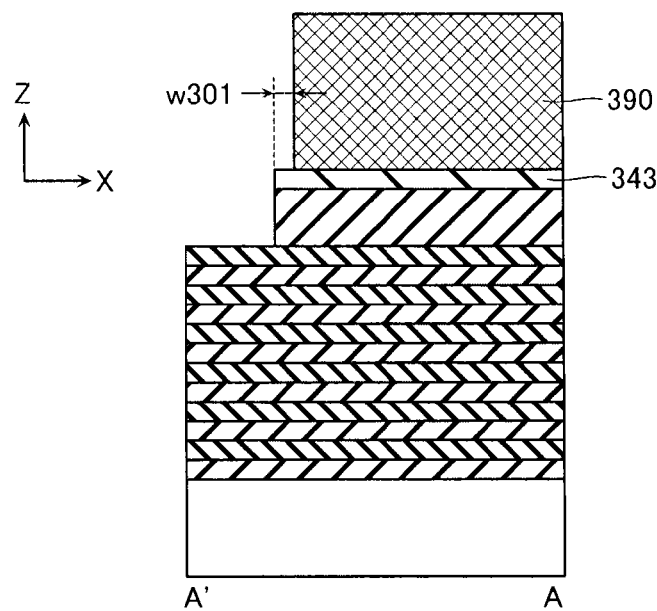

Then, as shown in FIGS. 9A and 9B, the resist 390 is slimmed. As a result, an end of the stopper layer 343 is exposed upwardly. A slimming width w301 is a terrace width of a stepped structure formed in the contact portion 373.

Figure 10A:
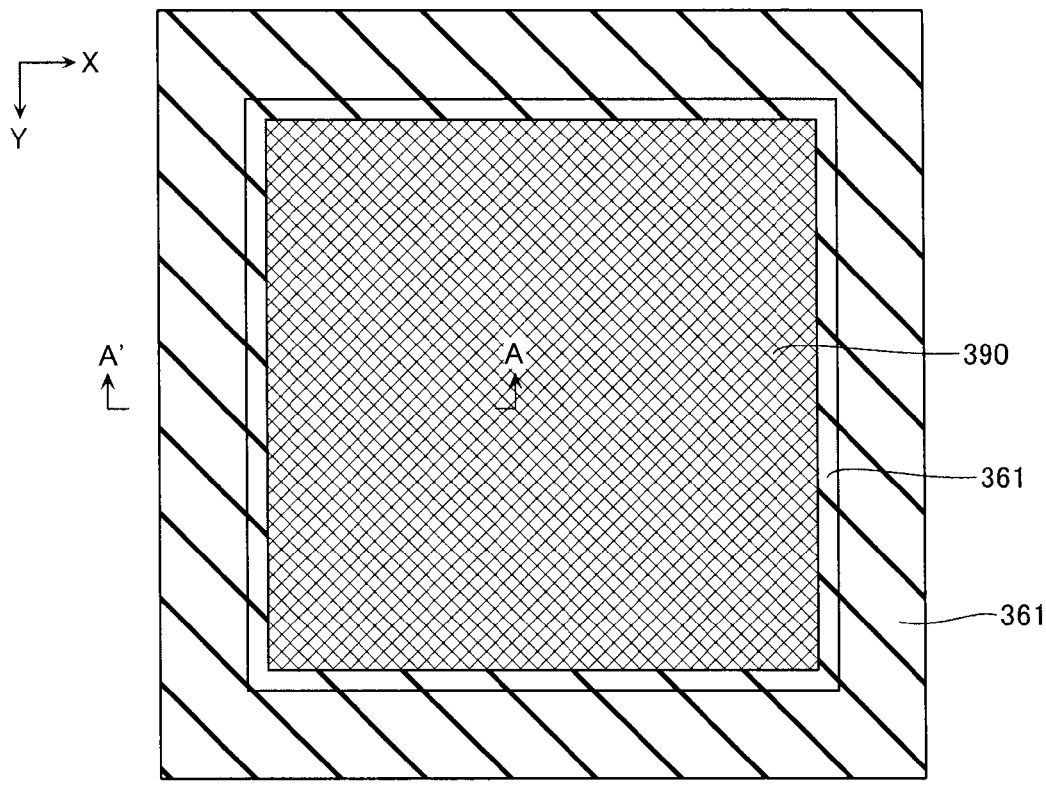
Figure 10B:
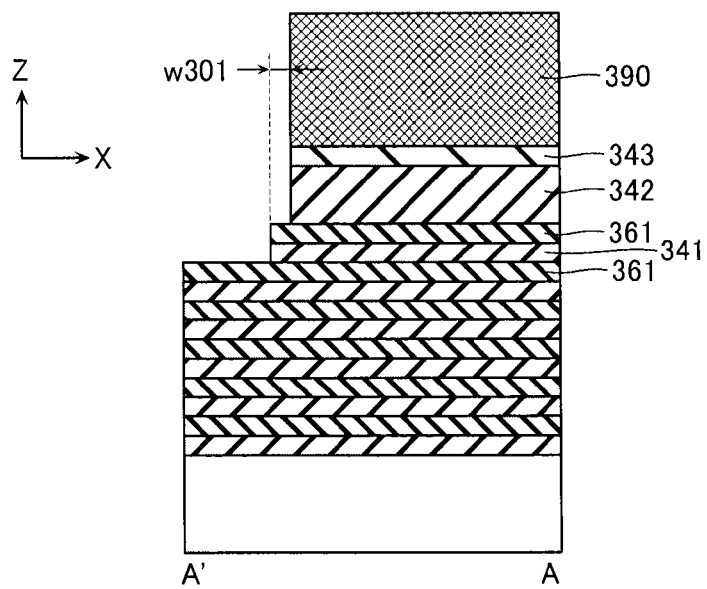

Then, as shown in FIGS. 10A and 10B, parts of the stopper layer 343 and the inter-layer insulating layer 342 are etched by a dry etching method that uses the resist 390 as a mask. Now, only amounts (w301) of the resist 390 slimmed in the step shown in FIGS. 9A and 9B, of the stopper layer 343 and the inter-layer insulating layer 342, are removed. At this time, the uppermost layer sacrifice layer 361 and inter-layer insulating layer 341, of a portion not having the stopper layer 343 and inter-layer insulating layer 342, are removed. As a result, an end of the second-from-above sacrifice layer 361 is exposed upwardly, and an end of the stacked body 370 is formed in steps.

Figure 11A:
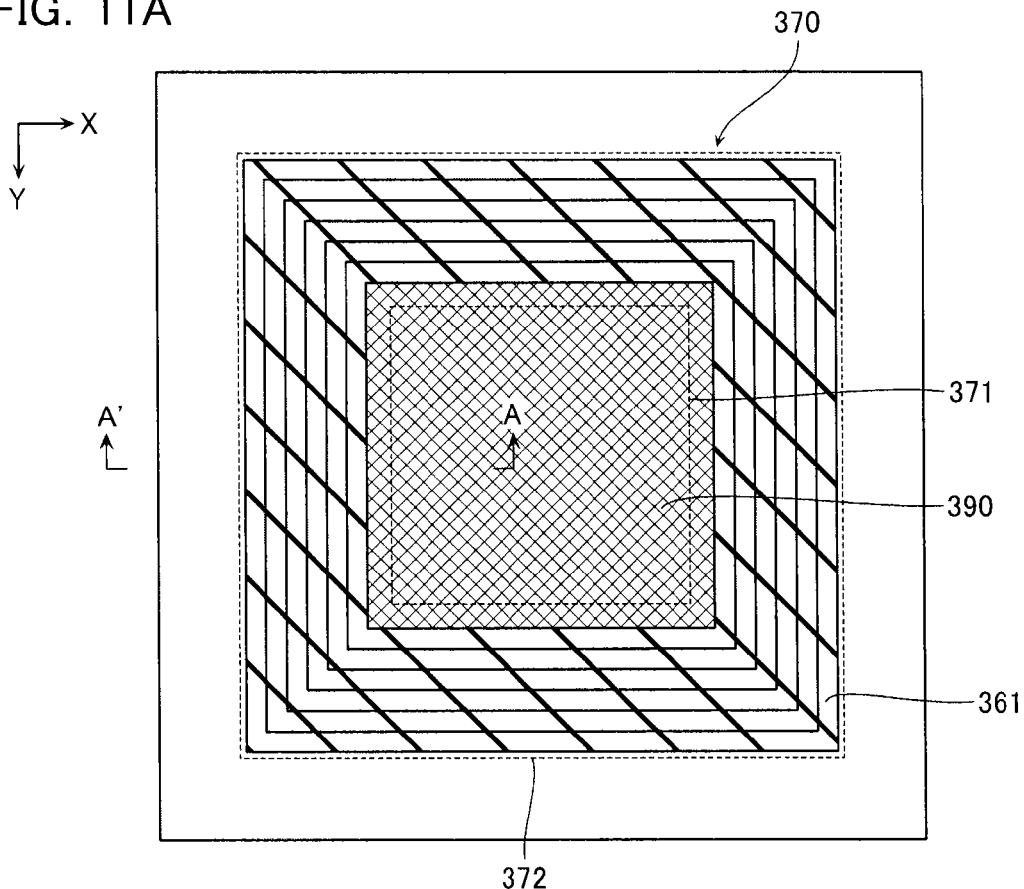
Figure 11B:
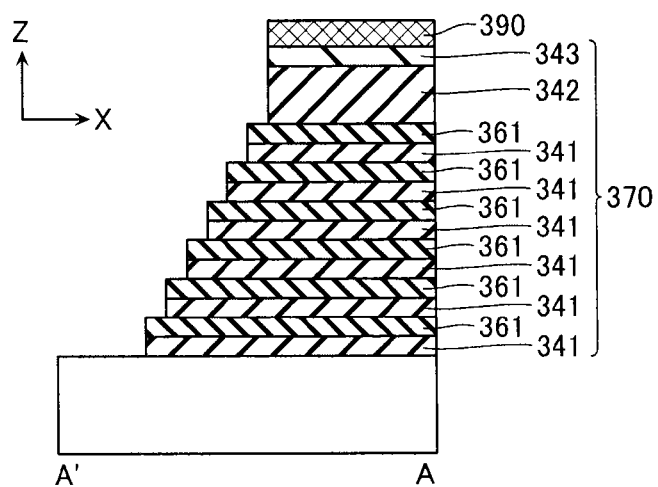

Thereafter, slimming of the resist 390 and partial removal of the stacked body 370 by a dry etching method shown in FIGS. 9A, 9B, 10A, and 10B are repeated to form a stepped structure of the outer peripheral portion 372 as shown in FIGS. 11A and 11B. Now, the resist 390 is slimmed until it becomes a final arrangement region of the stopper layer 343 covering the memory portion 371 when viewed from the Z direction. As a result, all of ends of the sacrifice layers 361 are exposed upwardly.

Then, the resist 390 is removed.

Finally, when the sacrifice layer 361 is replaced by the conductive layer 302, the memory cell array 300 shown in FIGS. 5A and 5B is formed.

In the case of the memory cell array 300 having a three-dimensional structure, in order to electrically connect each conductive layer 302 and a wiring line 310, end portions in the X direction of the plurality of conductive layers 302 are configured in a stepped structure, and the via 309 is contacted to the terrace formed in the end portion. However, only the contact portion 372 is employed in this contact with the via 309. In this regard, it can be said that the surplus portion 374 is a functionally unnecessary portion of the semiconductor memory device.

When processing the end of the stacked body 370 while slimming the substantially rectangular resist 390 as in the comparative example, the outer peripheral portion 372 gets formed in an entire periphery of the memory portion 371. As a result, a chip size of the semiconductor memory device ends up increasing. Conceivable as a method for solving this problem is a method in which the surplus portion 374 is removed by the likes of a dry etching method. However, because step differences of several μm possessed by a stepped structure are formed in the surplus portion 374, it becomes a problem that focus during lithography is difficult.

Accordingly, in the present embodiment, a memory cell array 100 having the following structure is employed as the memory cell array 1.

Figure 12A:
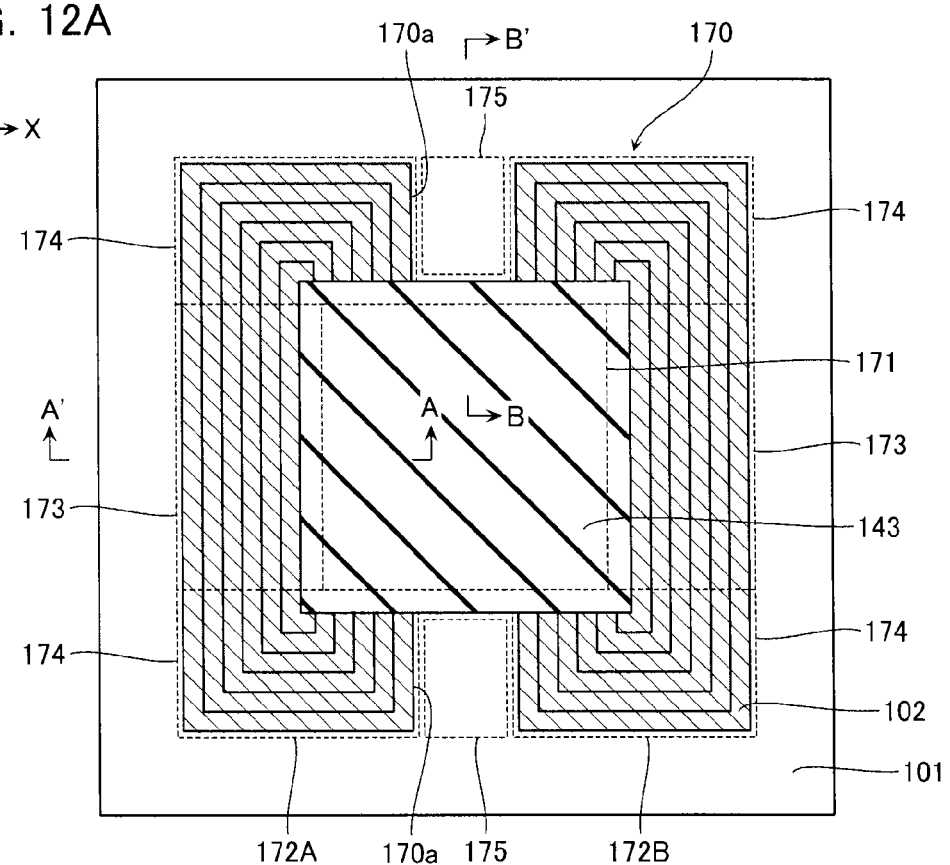
FIGS. 12A, 12B, and 12C are a plan view and cross-sectional views of the memory cell array in the semiconductor memory device according to the same embodiment.
Figure 12B:
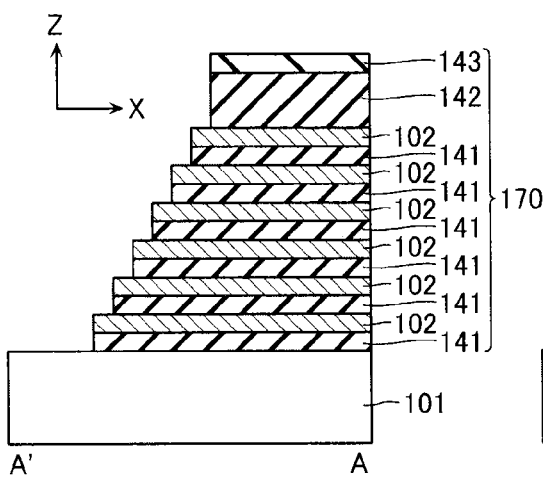
Figure 12C:
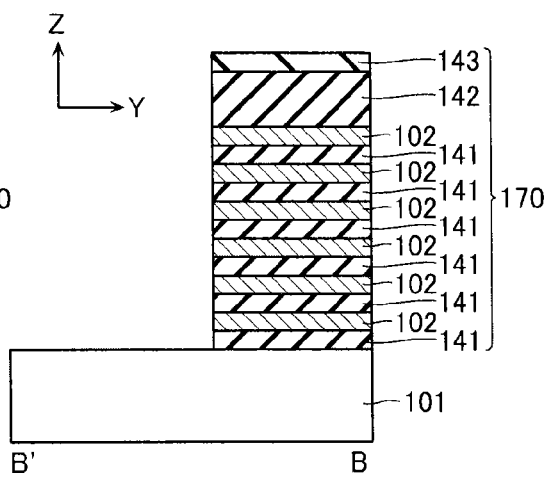

FIG. 12A is a plan view of the memory cell array in the semiconductor memory device according to the present embodiment. FIG. 12B is a cross-sectional view of the memory cell array taken along the line A-A' of FIG. 12A; and FIG. 12C is a cross-sectional view taken along the line B-B' of FIG. 12A.

The memory cell array 100 of the present embodiment includes a stacked body 170 on the semiconductor substrate 101, the stacked body 170 including: a plurality of inter-layer insulating layers 141 and the conductive layers 102 (first layers) stacked alternately in the Z direction; and a stopper layer 143 having a substantially rectangular outer shape and stacked via an inter-layer insulating layer 142 on the uppermost layer conductive layer 102. In other words, a top layer (second layer) of the stacked body 170 is the stopper layer 143.

The stacked body 170 has: a memory portion 171 which is substantially rectangular and covered by the stopper layer 143 when viewed from the Z direction; and outer peripheral portions 172A and 172B disposed close to both ends in the X direction of the memory portion 171. The outer peripheral portions 172A and 172B each have: a contact portion 173 (connecting line contact portion) which is in an arrangement range of the memory portion 171 in the Y direction and is adjacent in the X direction to the memory portion 171; and a surplus portion 174 (projecting portion) which is outside the arrangement range of the memory portion 171 in the Y direction and is adjacent in the Y direction to the memory portion 171 and the contact portion 173. Between the surplus portion 174 of the outer peripheral portion 172A and the surplus portion 174 of the outer peripheral portion 172B is divided by a gap 175 where there is no stacked structure. The stacked body 170 of the present embodiment, by there being this gap 175, has a substantially H-shaped outer shape having a narrow portion 170a at an end in the Y direction. Note that a Y direction-facing side surface of the memory portion 171 configuring the narrow portion 170a has a planar structure extending in the X-Z directions.

The memory portion 171, similarly to the memory portion 371 of the comparative example, includes a plurality of the memory columnar bodies 105 (not illustrated) that penetrate in the Z direction from the stopper layer 143 to the lowermost layer inter-layer insulating layer 141 to reach an upper surface of the semiconductor substrate 101.

The contact portion 173, similarly to the contact portion 373 of the comparative example, is formed in steps extending in the X direction from an end in the X direction of the memory portion 171, such that, when viewed from the Z direction, the contact portion 102a at an end of each of the conductive layers 102 is not concealed by another conductive layer 102 in a higher layer. The contact portion 173 is a portion where each conductive layer 102 and the via 109 are contacted.

The surplus portion 174, similarly to the surplus portion 374 of the comparative example, is formed in steps extending in the X direction and the Y direction from ends in the Y direction of the memory portion 171 and the contact portion 173. However, as previously mentioned, the surplus portions 174 are separated in the X direction by the gap 175. In this regard, the memory cell array 100 has an arrangement region of the outer peripheral portion 172 which is smaller than that of the memory cell array 300. As a result, in the case of the present embodiment, disposing the likes of a peripheral circuit or wiring line in this gap 175 enables chip size of the semiconductor memory device to be reduced compared to in the comparative example. In FIG. 12A, in order to make the structure of the memory cell array 100 easy to understand, a width in the X direction of the stepped structure possessed by the contact portion 173 with respect to a width in the X direction of the memory portion 171 is expressed larger than in reality, but in fact sometimes, whereas the width in the X direction of the memory portion 171 exceeds 1 mm, the width of the stepped structure possessed by the contact portion 173 is 100 μm or less, hence in such a case, a reduction effect of chip size becomes larger.

Next, a production method of the memory cell array 100 will be described.

FIGS. 13A to 18A are plan views explaining production steps of the memory cell array in the semiconductor memory device according to the present embodiment; FIGS. 13B to 18B are cross-sectional views explaining the production steps of the memory cell array, taken along the lines A-A' of FIGS. 13A to 18A; and FIGS. 13C to 18C are cross-sectional views explaining the production steps of the memory cell array, taken along the lines B-B' of FIGS. 13A to 18A.

First, similarly to in the step shown in FIGS. 6A and 6B, a plurality of the inter-layer insulating layers 141 and sacrifice layers 161 are stacked alternately in the Z direction on the semiconductor substrate 101 where a lower structure (not illustrated) has been formed. Now, the inter-layer insulating layer 141 is formed, for example, with a film thickness of 35 nm using silicon oxide ($SiO_2$) as its material. The sacrifice layer 161 is a layer replaced by the conductive layer 102 in a later step, and is formed, for example, with a film thickness of 35 nm using silicon nitride (SiN) as its material. Note that sometimes, the conductive layer 102 is stacked directly, instead of the sacrifice layer 161. In this case, the conductive layer 102 is formed by, for example, polysilicon (Poly-Si). Then, the inter-layer insulating layer 142 and the stopper layer 143 are stacked on the uppermost layer sacrifice layer 161. Now, the inter-layer insulating layer 142 is formed, for example, with a film thickness of 150 nm using silicon oxide ($SiO_2$) as its material. The stopper layer 143 is formed, for example, with a film thickness of 50 nm using silicon nitride (SiN) as its material. As a result, the stacked body 170 is formed.

Figure 13A:
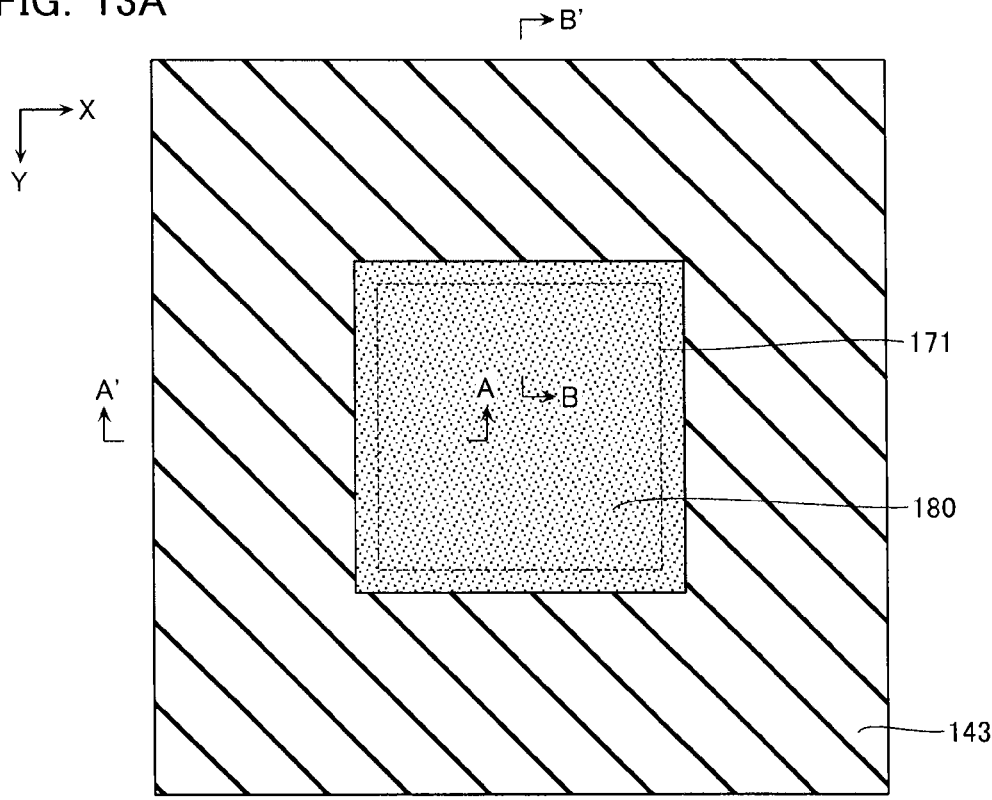
Figure 13B:
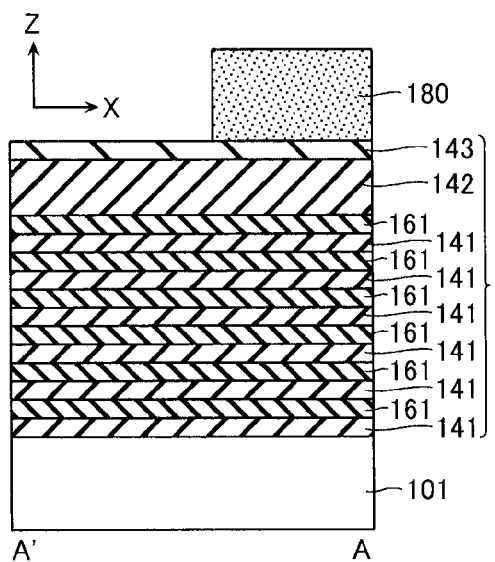
Figure 13C:
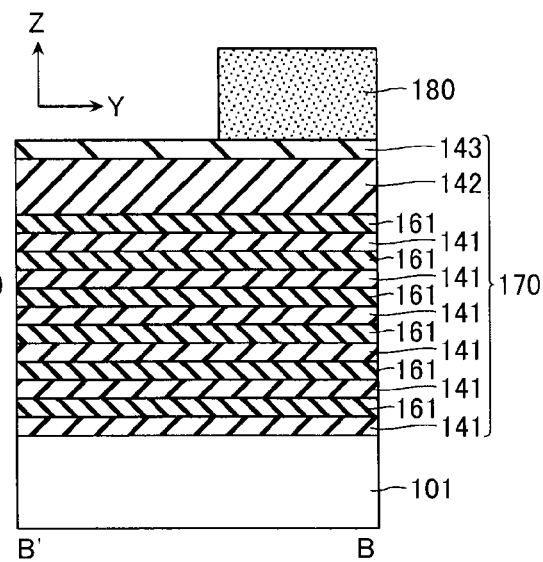

Then, as shown in FIGS. 13A to 13C, a hard mask 180 is formed on the stopper layer 143 by a lithography method and a dry etching method. At this time, the hard mask 180 is formed in a final arrangement region of the memory portion 171. Now, the hard mask 180 is formed with a film thickness of 100 nm using amorphous silicon (a-Si) as its material. An arrangement region of the hard mask 180 is a final arrangement region of the stopper layer 143 which is the top layer of the stacked body 170.

Figure 14A:
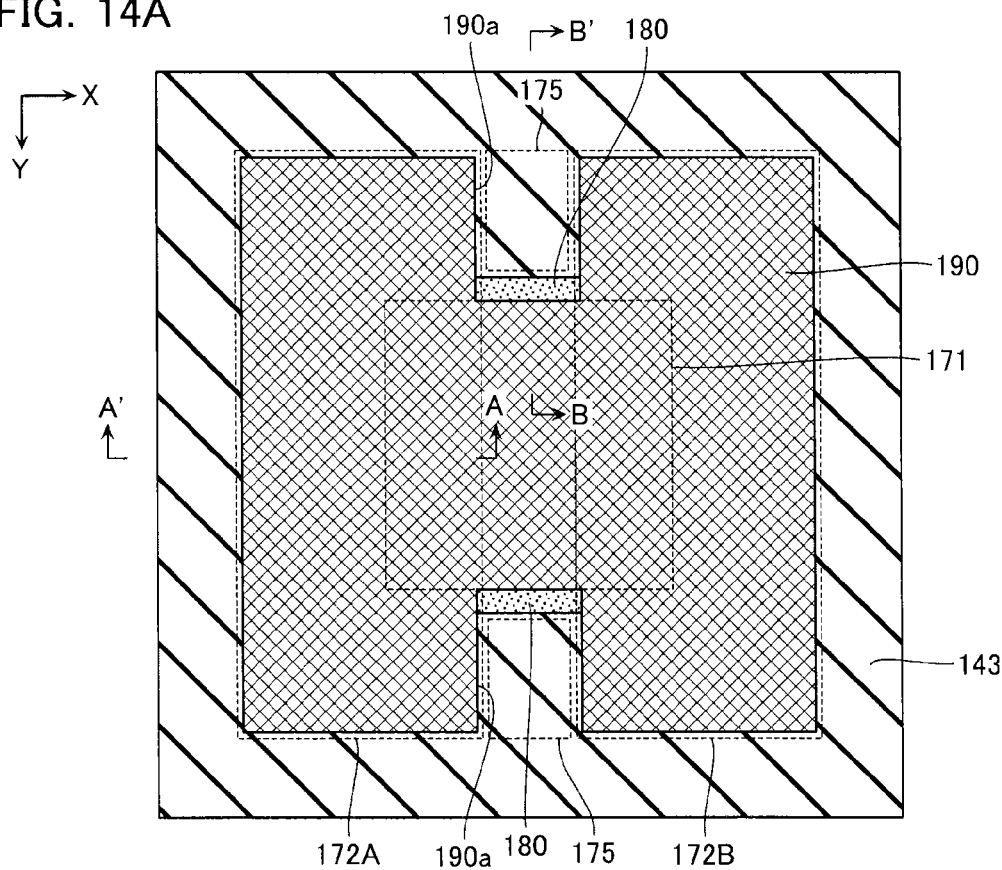
Figure 14B:
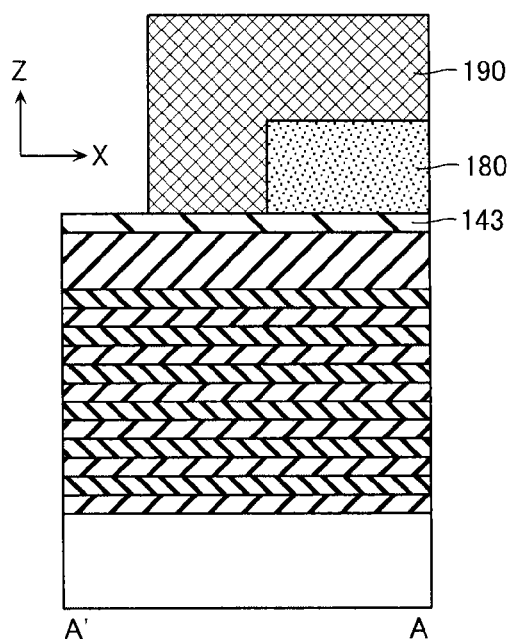
Figure 14C:
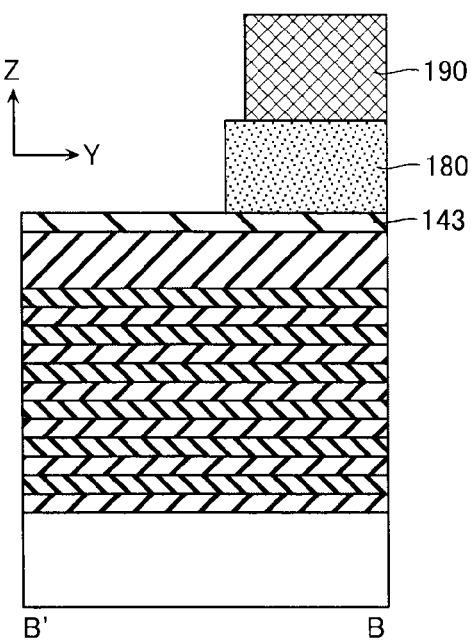

Then, as shown in FIGS. 14A to 14C, a resist 190 is formed on the stopper layer 143 and the hard mask 180 by a lithography method. At this time, the resist 190 is formed in a final arrangement region of the memory portion 171 and the outer peripheral portion 172. This resist 190 is different from the resist 390 of the comparative example, and has a substantially H-shaped outer shape having a narrow portion 190a at an end in the Y direction. This narrow portion 190a is recessed to a degree that an end in the Y direction of the hard mask 180 can be seen. As a result, the end of the hard mask 180 is exposed upwardly. An arrangement region of the hard mask 180 and the resist 190 at this time point is a final arrangement region of the lowermost layer inter-layer insulating layer 141 of the stacked body 170.

Figure 15A:
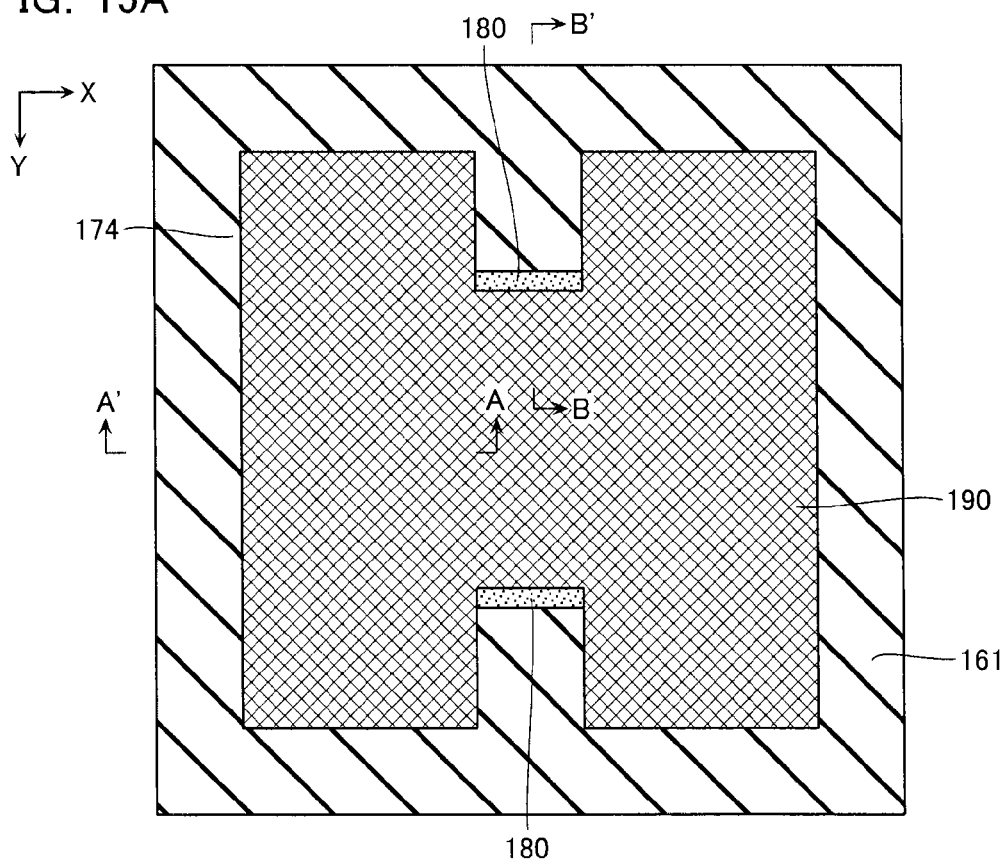
Figure 15B:
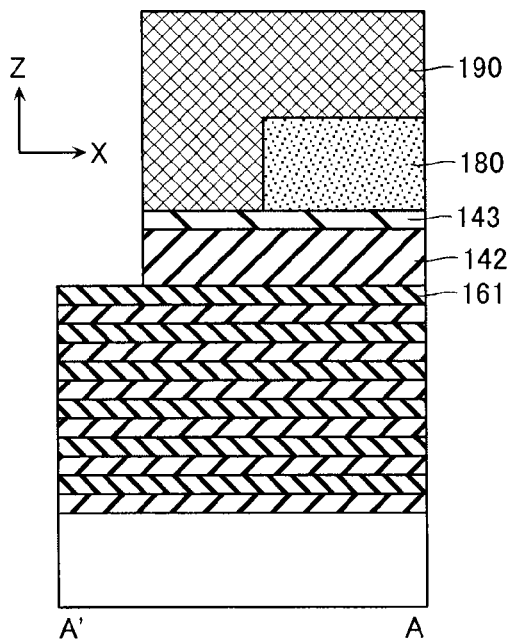
Figure 15C:
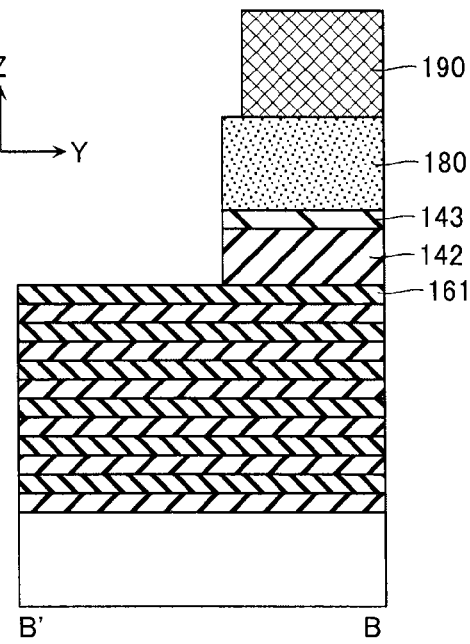

Then, as shown in FIGS. 15A to 15C, parts of the stopper layer 143 and the inter-layer insulating layer 142 are etched by a dry etching method that uses the resist 190 and the hard mask 180 as a mask. As a result, an end of the sacrifice layer 161 is exposed upwardly.

Figure 16A:
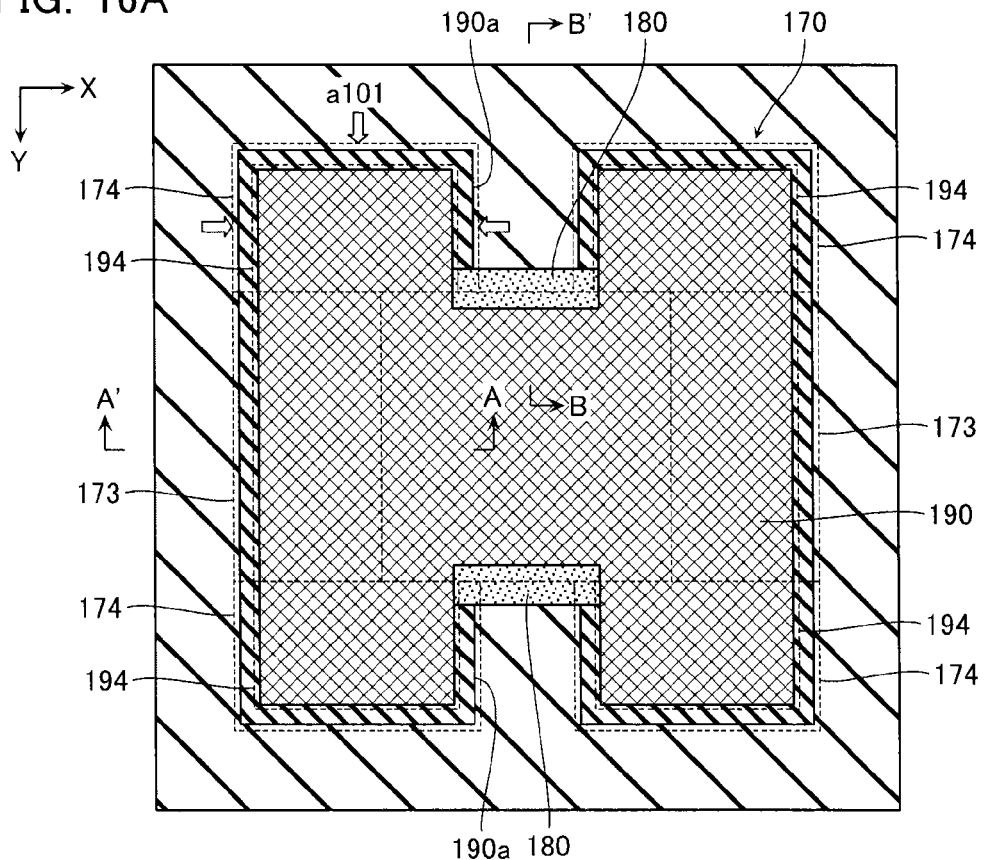
Figure 16B:
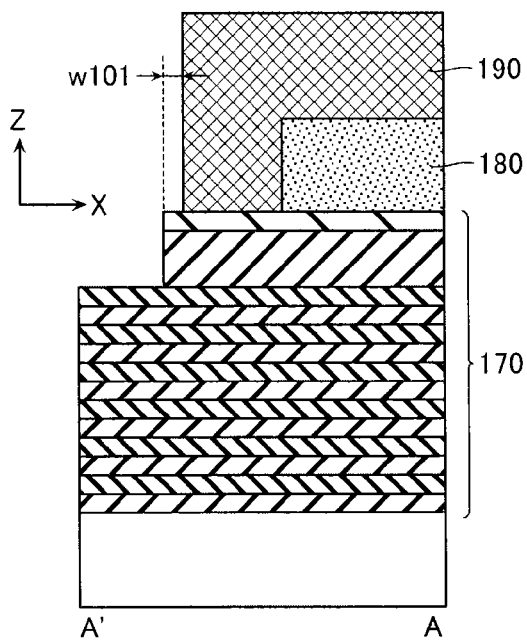
Figure 16C:
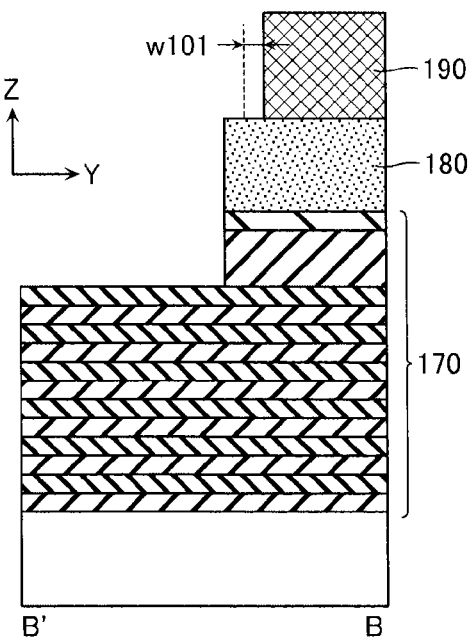

Then, as shown in FIGS. 16A to 16C, the resist 190 is slimmed. At this time, a projecting portion 194 on a final formation region of the surplus portion 174 of the stacked body 170, of the resist 190 is slimmed from three directions, as shown by the outline arrows a101 of FIG. 16A. A slimming width w101 is a terrace width of a stepped structure formed in the contact portion 173. Note that in this step, the end of the hard mask 180 exposed from the narrow portion 190a of the resist 190 is not slimmed.

Figure 17A:
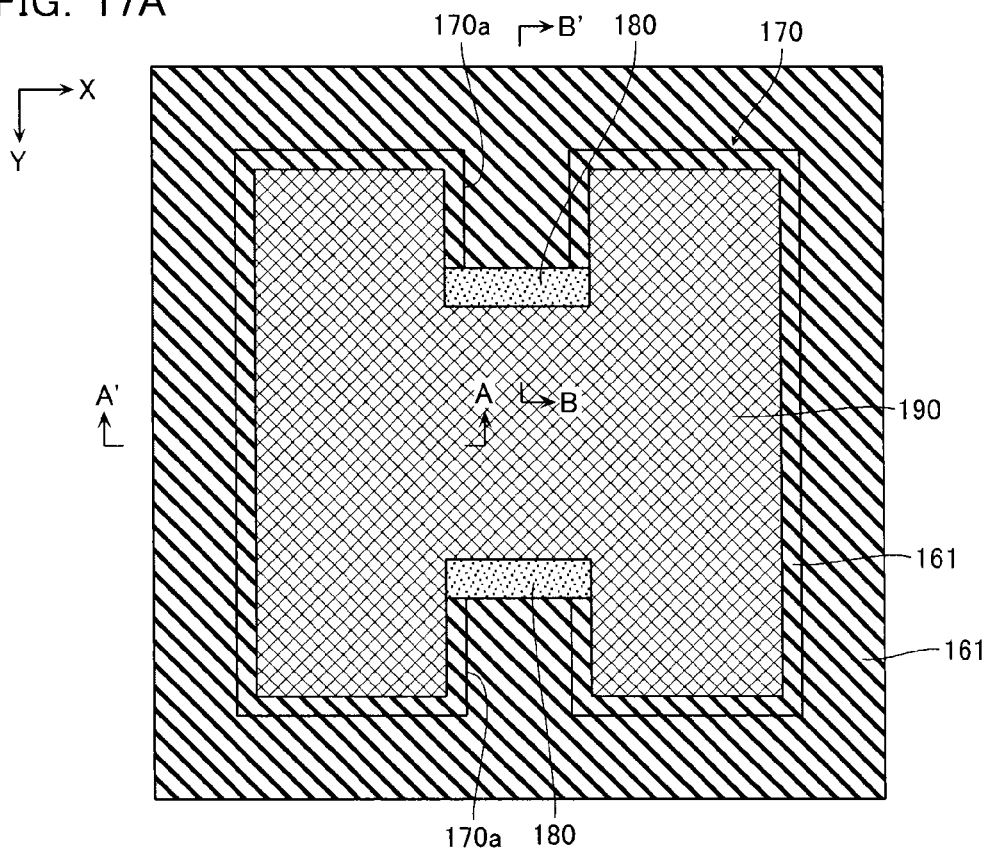
Figure 17B:
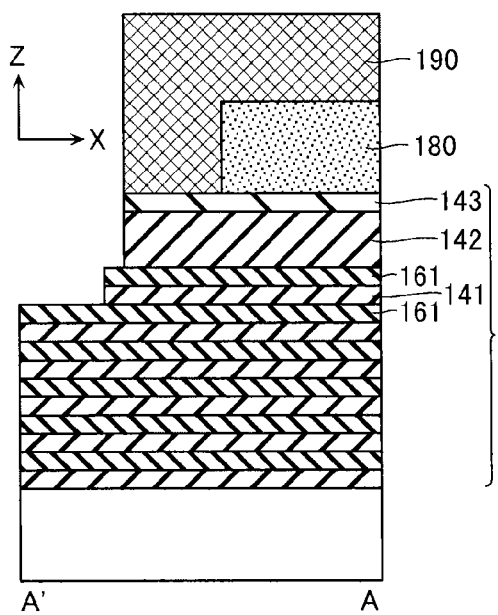
Figure 17C:
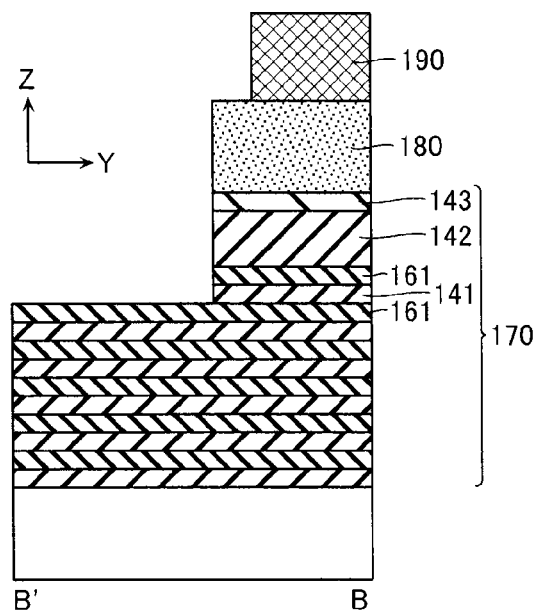

Then, as shown in FIGS. 17A to 17C, parts of the stopper layer 143 and the inter-layer insulating layer 142 are etched by a dry etching method that uses the resist 190 and the hard mask 180 as a mask. Now, only amounts (w101) of the resist 190 slimmed in the step shown in FIGS. 16A to 16C, of the stopper layer 143 and the inter-layer insulating layer 142, are removed. At this time, the uppermost layer sacrifice layer 161 and inter-layer insulating layer 141, of a portion not having the stopper layer 143 and inter-layer insulating layer 142, are removed. As a result, an end of the second-from-above sacrifice layer 161 is exposed upwardly, and an end of the stacked body 170 is formed in steps. Moreover, in the case of the present embodiment, the stopper layer 143, inter-layer insulating layer 142, sacrifice layer 161, and inter-layer insulating layer 141 are removed along the hard mask 180 exposed from the narrow portion 190a of the resist 190, hence a stacked structure like that of the contact portion 173 is not formed in a Y direction-facing side surface of the stacked body 170 configuring the narrow portion 170a.

Figure 18A:
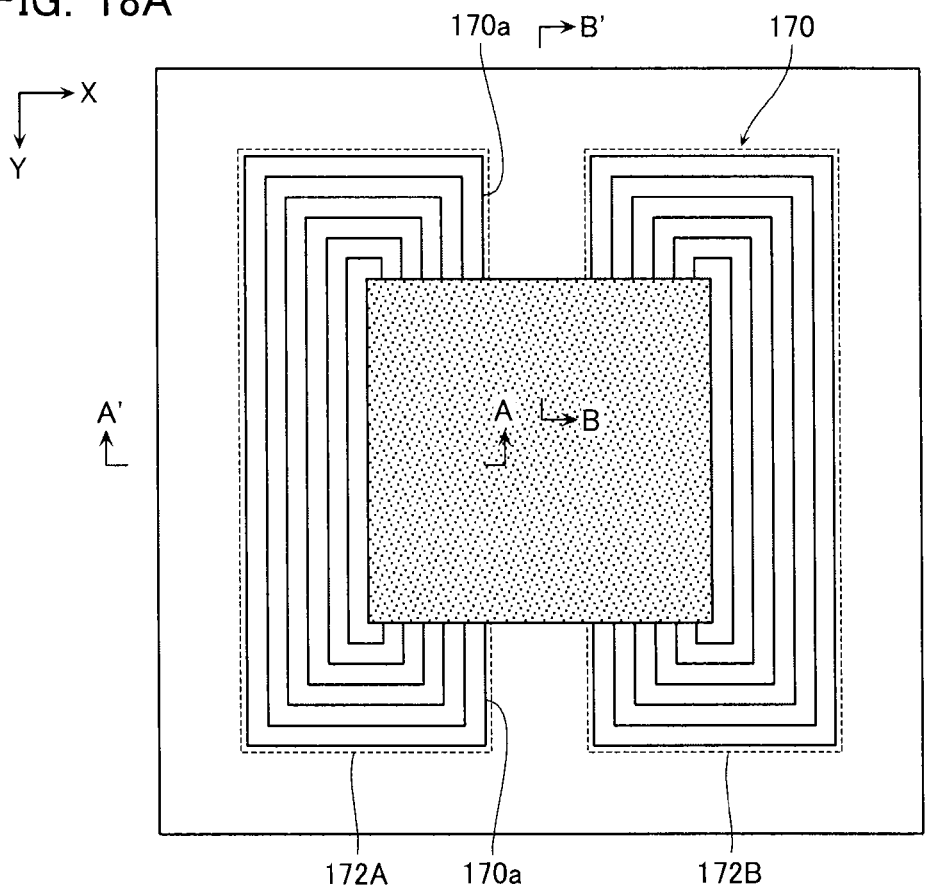
Figure 18B:
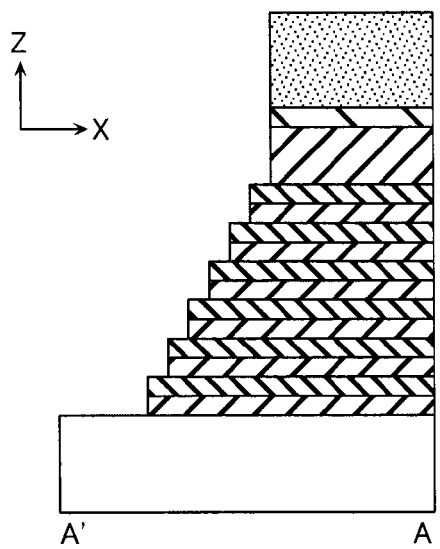
Figure 18C:
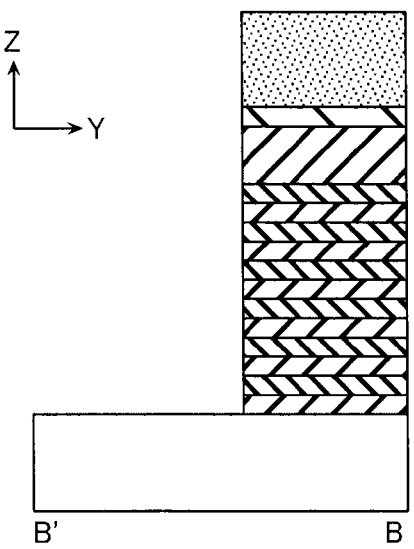

Thereafter, slimming of the resist 190 and partial removal of the stacked body 170 by a dry etching method shown in FIGS. 16A to 16C and 17A to 17C are repeated to form a stepped structure of the outer peripheral portion 172 as shown in FIGS. 18A to 18C. At this time, as previously mentioned, the Y direction-facing side surface of the stacked body 170 configuring the narrow portion 170a is not formed in steps, but is formed as a wall extending in the X-Z directions. Moreover, the projecting portion 194 of the resist 190 is slimmed from three directions, as shown by the outline arrows a101 of FIG. 16A, hence the surplus portion 174 of the stacked body 170 is formed in steps extending in these three directions. Note that the projecting portion 194 of the resist 190 may eventually be completely removed by slimming. In this case, the resist 190 is left in a substantially rectangular shape.

Then, the resist 190 is removed.

Finally, when the sacrifice layer 161 is replaced by the conductive layer 102, the memory cell array 100 shown in FIGS. 12A to 12C is formed. Now, the conductive layer 102 is formed by, for example, tungsten (W).

Next, advantages of the memory cell array 100 formed by the above-described production steps will be described.

Figure 19:
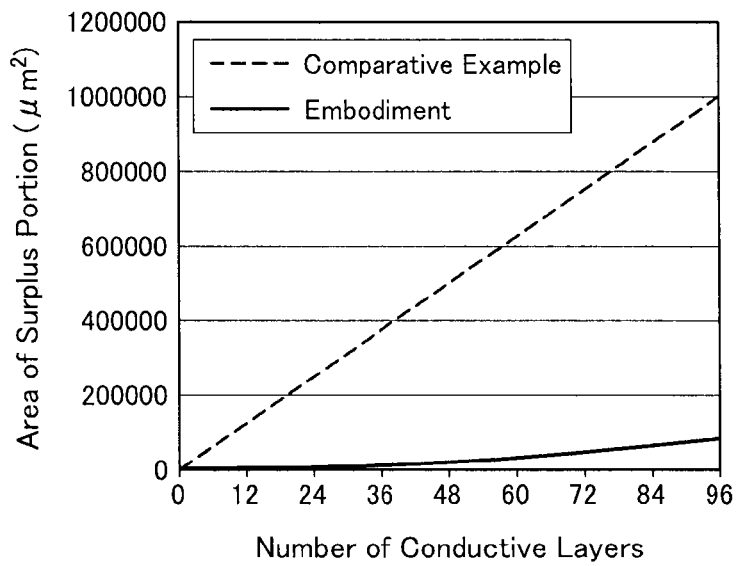
FIG. 19 is a graph showing a relationship between number of conductive layers and area of unnecessary region of the memory cell array in the semiconductor memory devices according to the same embodiment and the same comparative example.

FIG. 19 is a graph showing a relationship between number of conductive layers and area of unnecessary region of the memory cell array in the semiconductor memory devices according to the present embodiment and the comparative example. FIG. 19 shows the case where a shape viewed from the Z direction of the top layer of the memory cell arrays 100 and 300 is assumed to be a square of 5000 μm×5000 μm, and a terrace width of each of the conductive layers 102 and 302 is assumed to be 1 μm.

As is clear from FIG. 19, in the case of the present embodiment, an increase in the surplus portion 174 with increase in the number of layers of the conductive layers 102 is found to be smaller compared to in the comparative example. In other words, as a result of the present embodiment, the larger the number of layers of the conductive layers 102, the larger is the reduction effect of arrangement area of the surplus portion 174 that can be obtained, compared to in the comparative example.

Next, size of the surplus portion 174 of the stacked body 170 will be described.

FIGS. 20A and 20B to 22A and 22B are plan views of a surplus portion periphery of the memory cell array in the semiconductor memory device according to the present embodiment. FIGS. 20A to 22A are final plan views of the stacked body 170; and FIGS. 20B to 22B are plan views showing an arrangement region of the hard mask 180 and a state of change due to slimming of the resist 190. Note that for simplification of description, FIGS. 20A and 20B to 22A and 22B assume the number of conductive layers 102 to be four layers.

In the description below, a width in the X direction of the stepped structure of the contact portion 173 is assumed to be Tsum, a terrace width of the uppermost layer conductive layer 102 of the stacked body 170 is assumed to be Tupper, a width in the X direction of the surplus portion 174 is assumed to be Wproj, and a length in the Y direction of the surplus portion 174 is assumed to be Lproj (refer to FIG. 20A).

Figure 20A:
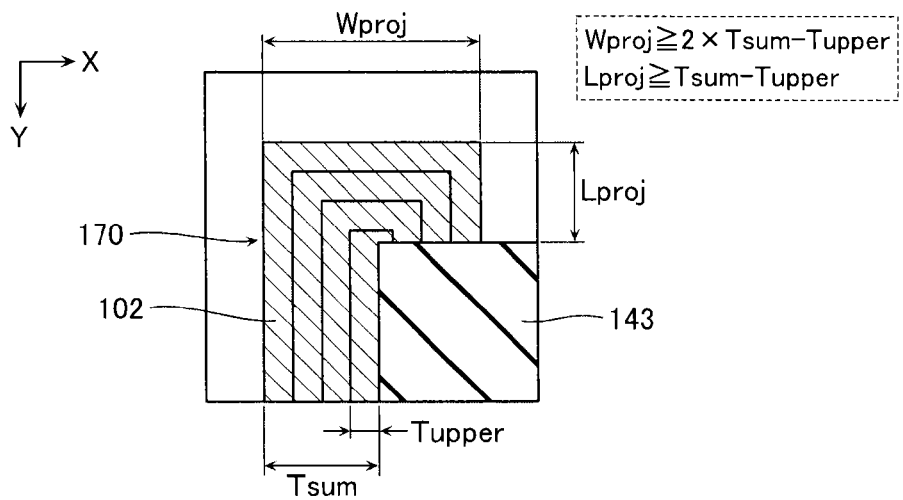
Figure 20B:
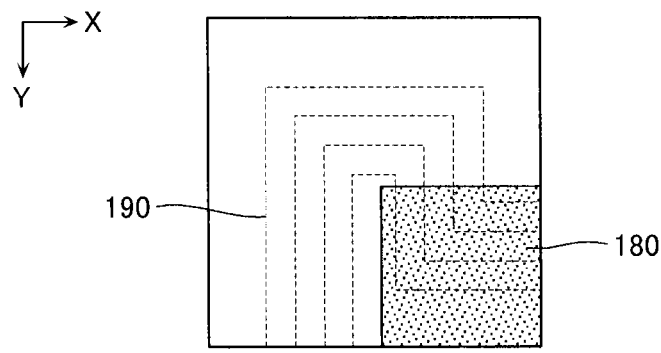

FIGS. 20A and 20B are for the case where Wproj≥2×Tsum−Tupper and Lproj≥Tsum−Tupper. In this case, no particular problem occurs in the structure of the stacked body 170.

Figure 21A:
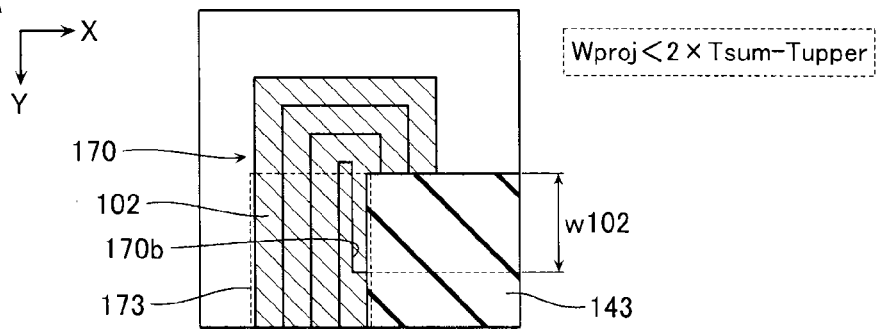
Figure 21B:
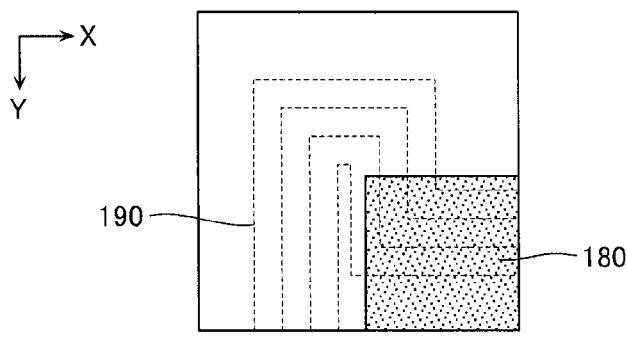

FIGS. 21A and 21B are for the case where Wproj<2×Tsum−Tupper. In this case, a gap occurs between the projecting portion 190a of the resist 190 after slimming and the hard mask 180. This gap eventually becomes a slit 170b of the stacked body 170, and a formation portion of the top layer (stopper layer 143) of the stacked body 170 and the contact portion 173 get divided in a formation range of the slit 170b. In this case, since inside the formation range of the slit 170b in the Y direction cannot be employed as the memory portion 171, a non-utilizable portion ends up increasing by an amount proportional to a width w102.

Figure 22A:
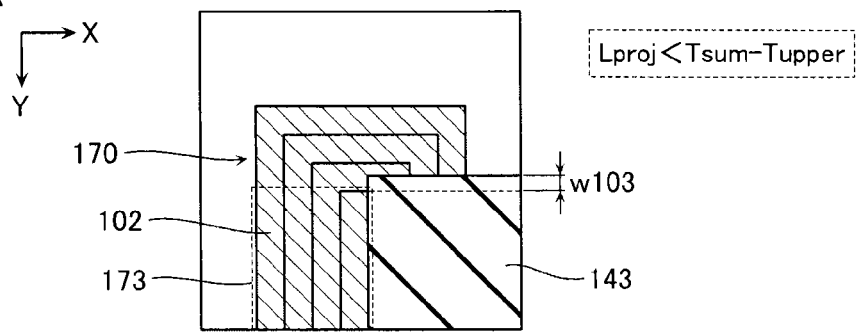
Figure 22B:
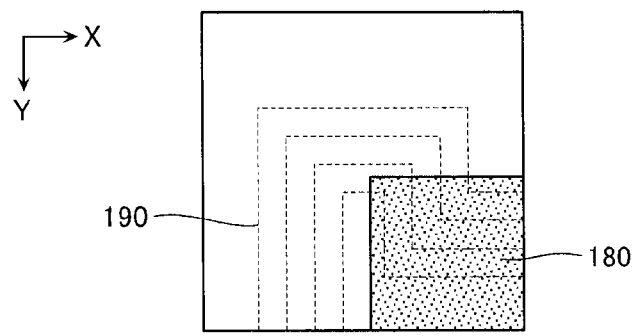

FIGS. 22A and 22B are for the case where Lproj<Tsum−Tupper. In this case, in the Y direction, a formation range of the contact portion 173 becomes shorter than a formation range of the top layer (stopper layer 143) of the stacked body 170 by an amount of a width w103, and a non-utilizable portion ends up increasing by an amount proportional to the width w103.

It can be said from the above to be desirable that the surplus portion 174 of the stacked body 170 satisfies Wproj≥2×Tsum−Tupper and Lproj≥Tsum−Tupper.

In the present embodiment, processing the stacked body using a hard mask and a substantially H-shaped resist as a mask makes it possible to reduce the surplus portion while securing a necessary contact portion. This makes it possible to provide a semiconductor memory device of smaller chip size compared to in the comparative example.

Second Embodiment

In a second embodiment, a modified example of the first embodiment having a different outer shape of the top layer of the stacked body, will be described. Mainly, differences from the first embodiment will be described below.

Figure 23:
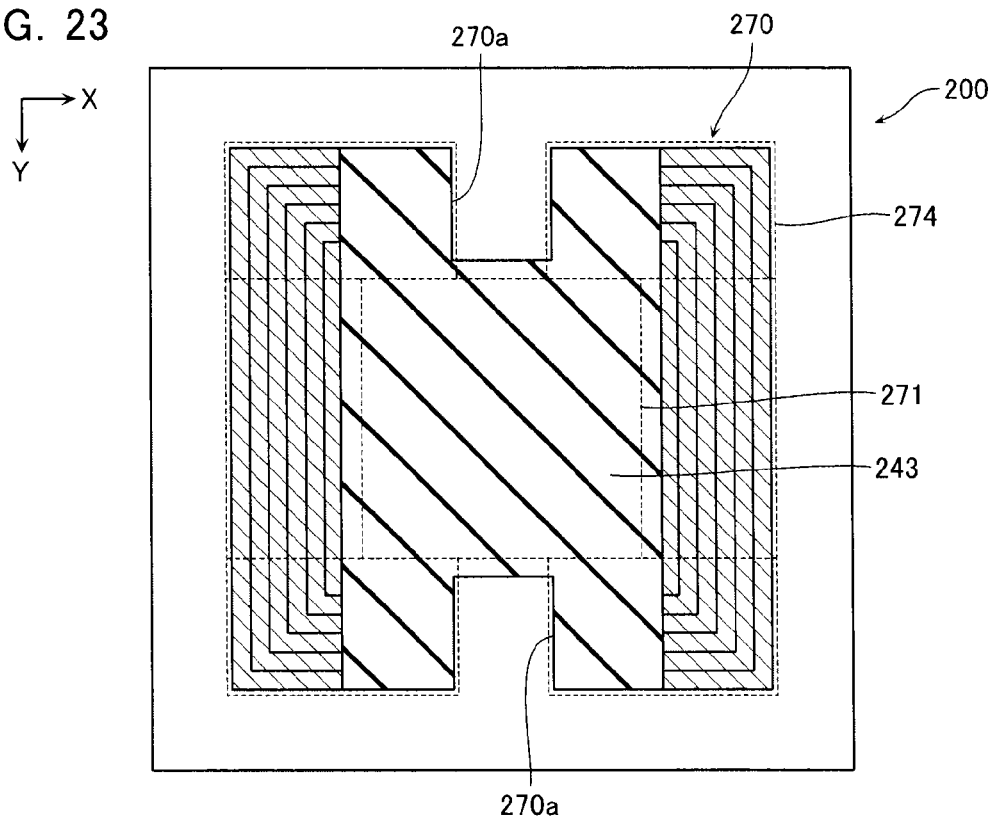
FIG. 23 is a plan view of a memory cell array in a semiconductor memory device according to a second embodiment.

FIG. 23 is a plan view of a memory cell array in a semiconductor memory device according to the present embodiment.

A stacked body 270 (corresponding to 170) of a memory cell array 200 of the present embodiment has a substantially H-shaped outer shape when viewed from the Z direction similarly to that of the memory cell array 100, and an arrangement area of the stacked body is also the same as in the memory cell array 100.

However, in the memory cell array 200, contrary to in the memory cell array 100, a stopper layer 243 (corresponding to 143) which is the top layer of the stacked body 270 has a substantially H-shaped outer shape when viewed from the Z direction. This stopper layer 243 is formed in a formation region of a memory portion 271 (corresponding to 171) in the X direction and part of a formation region of a surplus portion 274 (corresponding to 174). In other words, the stopper layer 243 which is the top layer has a larger area than the top layer of the memory cell array 100. Moreover, in the memory cell array 200, contrary to in the memory cell array 100, three side surfaces configuring a narrow portion 270a of the stacked body 270 are each not formed in steps, but formed as walls extending in the X-Z directions or the Y-Z directions.

Next, a production method of the memory cell array 200 will be described.

Figure 24:
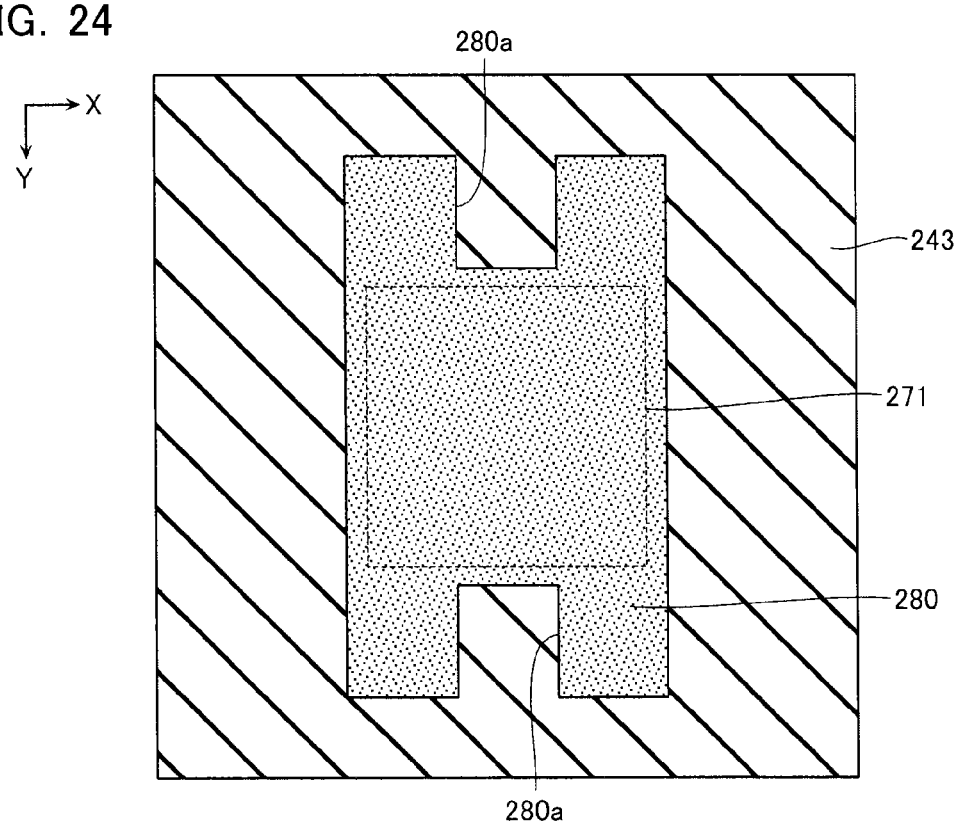
FIGS. 24 and 25 are plan views explaining production steps of the memory cell array in the semiconductor memory device according to the same embodiment.
Figure 25:
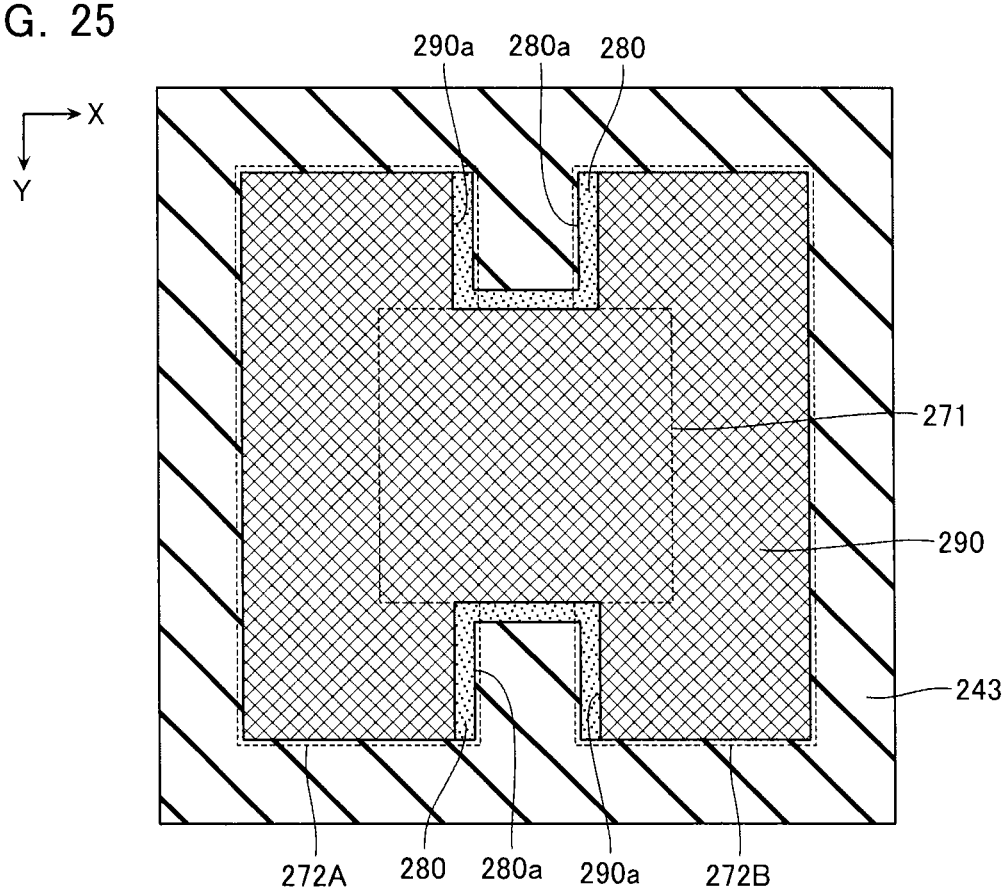

FIGS. 24 and 25 are plan views explaining production steps of the memory cell array in the semiconductor memory device according to the present embodiment.

First, similarly to in the step shown in FIGS. 6A and 6B, the stacked body 270 including a plurality of inter-layer insulating layers 241 (corresponding to 141), a plurality of sacrifice layers 261 (corresponding to 161), an inter-layer insulating layer 242 (corresponding to 142), and a stopper layer 243 (corresponding to 143) which is the top layer, is formed on a semiconductor substrate 201 (corresponding to 101).

Then, as shown in FIG. 24, a hard mask 280 is formed on the stopper layer 243 by a lithography method and a dry etching method. At this time, the stopper layer 243 is formed in an arrangement range of the memory portion 271 in the X direction of a final arrangement region of the stacked body 270. Therefore, the hard mask 280 has a substantially H-shaped outer shape having a narrow portion 280a at an end in the Y direction. An arrangement region of the hard mask 280 is a final arrangement region of the stopper layer 243 which is the top layer of the stacked body 270.

Then, as shown in FIG. 25, a resist 290 is formed on the stopper layer 243 and the hard mask 280 by a lithography method. At this time, the resist 290 is formed in a final arrangement region of the memory portion 271 and an outer peripheral portion 272. Therefore, the resist 290 has a substantially H-shaped outer shape having a narrow portion 290a at an end in the Y direction. The narrow portion 290a of the resist 290 is formed to a degree that an end of the narrow portion 280a of the hard mask 280 can be seen. As a result, the hard mask 280 is exposed upwardly from the narrow portion 290a of the resist 290. An arrangement region of the hard mask 280 and the resist 290 at this time point is a final arrangement region of the lowermost layer inter-layer insulating layer 241 of the stacked body 270.

Thereafter, the memory cell array 200 shown in FIG. 23 is formed by similar steps to the steps shown from FIGS. 16A to 16C in the first embodiment.

The above is part of production steps of the memory cell array 200, but in reality, a wiring line layer must be formed on the stacked body 270, hence after the above-described production steps, an insulating film covering the entire stacked body 270 is deposited, and then a step in which this insulating film is planarized by CMP, is executed.

In that respect, as previously mentioned, the memory cell array 200 of the present embodiment has an area of the top layer of the stacked body 270 which is larger than an area of the top layer of the stacked body 170 of the memory cell array 100. In other words, in the case of the present embodiment, a recess of the top layer of the stacked body 270 can be made smaller, hence planarization by CMP can be performed more easily, compared to in the first embodiment.

As indicated above, the present embodiment enables more reduction of chip size to be achieved compared to in the comparative example, similarly to in the first embodiment, and enables production steps of the memory cell array to be performed more easily compared to in the first embodiment.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   when three directions intersecting each other are assumed to be a first direction, a second direction, and a third direction,
   a memory cell array, the memory cell array including a stacked body and a semiconductor film, the stacked body including a plurality of first layers stacked in the third direction, the semiconductor film having a side surface facing the plurality of first layers, and the semiconductor film extending in the third direction,
   the stacked body having a first portion and two second portions, the first portion having two first ends which are ends in the first direction, and the first portion having the semiconductor film disposed therein, and each second portion being positioned on a side of each first end of the first portion, and each second portion having disposed therein a connecting line that contacts one of the plurality of first layers and extends in the third direction,
   each second portion having a projecting portion that projects further in the second direction than the first portion,
   the projecting portion of one of the second portions and the projecting portion of another of the second portions being divided in the first direction by a gap which is surrounded on three sides by the first portion and these two projecting portions, and
   a side surface facing the gap of the projecting portion of one of the second portions having a stepped structure extending in the first direction, and a side surface facing the gap of the first portion having a planar structure extending in the first direction and the third direction.

2. The semiconductor memory device according to claim 1, wherein each of the second portions has a stepped connecting line contact portion that extends in the first direction from the first end of the first portion.

3. The semiconductor memory device according to claim 2, wherein if a width in the first direction of the projecting portion of said one of the second portions is assumed to be W, a width in the first direction of the connecting line contact portion is assumed to be Ts, and a width in the first direction of a step formed at an end of the uppermost layer first layer of the connecting line contact portion is assumed to be Tu, then the second portions satisfy W≥2×Ts−Tu.

4. The semiconductor memory device according to claim 2, wherein if a length in the second direction of the projecting portion of said one of the second portions is assumed to be L, a width in the first direction of the connecting line contact portion is assumed to be Ts, and a width in the first direction of a step formed at an end of the uppermost layer first layer of the connecting line contact portion is assumed to be Tu, then the second portions satisfy L≥Ts−Tu.

5. The semiconductor memory device according to claim 1, wherein
the stacked body includes a second layer stacked on the plurality of first layers, and
the second layer is disposed over the first portion and the projecting portions of the second portions.

6. The semiconductor memory device according to claim 1, wherein each of the projecting portions having a side surface facing the first direction different from the side surface facing the gap having the stepped structure extending in the first direction, and a side surface facing the second direction having a stepped structure extending in the second direction.

7. A semiconductor memory device, comprising:
when three directions intersecting each other are assumed to be a first direction, a second direction, and a third direction,
a memory cell array, the memory cell array including a stacked body and a semiconductor film, the stacked body including a plurality of first layers stacked in the third direction, the semiconductor film having a side surface facing the plurality of first layers, and the semiconductor film extending in the third direction,
the stacked body having a first portion and two second portions, the first portion having two first ends which are ends in the first direction, and the first portion having the semiconductor film disposed therein, and each second portion being positioned on a side of each first end of the first portion, and each second portion having disposed therein a connecting line that contacts one of the plurality of first layers and extends in the third direction,
the stacked body having a substantially H-shaped outer shape when viewed from the third direction,
each second portion having a projecting portion that projects further in the second direction than the first portion,
the projecting portion of one of the second portions and the projecting portion of another of the second portions being divided in the first direction by a gap which is surrounded on three sides by the first portion and these two projecting portions, and
a side surface facing the gap of the projecting portion of one of the second portions having a stepped structure extending in the first direction, and a side surface facing the gap of the first portion having a planar structure extending in the first direction and the third direction.

8. The semiconductor memory device according to claim 7, wherein each of the second portions has a stepped connecting line contact portion that extends in the first direction from the first end of the first portion.

9. The semiconductor memory device according to claim 8, wherein if a width in the first direction of the projecting portion of said one of the second portions is assumed to be W, a width in the first direction of the connecting line contact portion is assumed to be Ts, and a width in the first direction of a step formed at an end of the uppermost layer first layer of the connecting line contact portion is assumed to be Tu, then the second portions satisfy W≥2×Ts−Tu.

10. The semiconductor memory device according to claim 8, wherein if a length in the second direction of the projecting portion of said one of the second portions is assumed to be L, a width in the first direction of the connecting line contact portion is assumed to be Ts, and a width in the first direction of a step formed at an end of the uppermost layer first layer of the connecting line contact portion is assumed to be Tu, then the second portions satisfy L≥Ts−Tu.

11. The semiconductor memory device according to claim 7, wherein
the stacked body includes a second layer stacked on the plurality of first layers, and
the second layer has a substantially rectangular outer shape when viewed from the third direction.

12. The semiconductor memory device according to claim 7, wherein each of the projecting portions having a side surface facing the first direction different from the side surface facing the gap having the stepped structure extending in the first direction, and a side surface facing the second direction having a stepped structure extending in the second direction.

* * * * *